(12) United States Patent
Marti et al.

(10) Patent No.: US 10,416,205 B2
(45) Date of Patent: Sep. 17, 2019

(54) MONITORING OF RESOURCE CONSUMPTION PATTERNS IN AN AUTOMATED ENVIRONMENT INCLUDING DETECTING VARIANCE IN RESOURCE CONSUMPTION

(71) Applicant: Apple Inc., Cupertino, CA (US)

(72) Inventors: Lukas M. Marti, San Jose, CA (US); Ronald Keryuan Huang, San Jose, CA (US); Arun G. Mathias, Los Gatos, CA (US); Kevin P. McLaughlin, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 234 days.

(21) Appl. No.: 14/856,239

(22) Filed: Sep. 16, 2015

(65) Prior Publication Data

US 2016/0091540 A1    Mar. 31, 2016

Related U.S. Application Data

(60) Provisional application No. 62/057,747, filed on Sep. 30, 2014.

(51) Int. Cl.
*G01R 21/133*    (2006.01)

(52) U.S. Cl.
CPC ....... *G01R 21/133* (2013.01); *G01R 21/1333* (2013.01)

(58) Field of Classification Search
CPC .............. G01R 21/133; G01R 21/1331; G01R 21/1333; G01R 21/1335; G01R 21/1336;
(Continued)

(56) References Cited

U.S. PATENT DOCUMENTS 8,214,061 B2    7/2012  Westrick, Jr. et al.
8,255,090 B2    8/2012  Frader-Thompson et al.
(Continued)

FOREIGN PATENT DOCUMENTS

CN      101459725       6/2009
CN      102736599       10/2012
WO      2013184108      12/2013

OTHER PUBLICATIONS

Weiss, Markus, et al., "Leveraging smart meter data to recognize home appliances," [online] 2012, [retrieved from the internet], <URL: www.im.ethz.ch/publications/weiss_Percom2012.pdf<, 8 pages.
(Continued)

*Primary Examiner* — Gene N Auduong
(74) *Attorney, Agent, or Firm* — Kilpatrick Townsend & Stockton LLP

(57) ABSTRACT

An automated environment can monitor its resource consumption at the environment level and detect anomalies. Resource consumption can be monitored using a sparse set of sensors that provide information about the total resource consumption of the automated environment. The sensor data can be analyzed together with information about a behavioral routine of users in the automated environment to define a baseline resource consumption pattern. Once a baseline resource consumption pattern is established, anomalies in resource consumption can be detected and reported to users.

25 Claims, 7 Drawing Sheets

(58) Field of Classification Search
CPC . G01R 21/1338; G06F 21/556; G06F 21/316; G06F 8/34; G06Q 30/02; G06Q 50/06
USPC .............................................. 702/62, 61, 60
See application file for complete search history.

(56) References Cited

U.S. PATENT DOCUMENTS

| | | | |
|---|---|---|---|
| 8,630,741 B1* | 1/2014 | Matsuoka | H04L 12/2829 700/12 |
| 8,909,950 B1 | 12/2014 | Levchuk et al. | |
| 8,989,910 B1* | 3/2015 | Klots | G06Q 50/06 700/291 |
| 8,996,188 B2 | 3/2015 | Frader-Thompson et al. | |
| 9,274,512 B1 | 3/2016 | Zima | |
| 9,351,381 B2 | 5/2016 | Verfuerth et al. | |
| 9,432,210 B2 | 8/2016 | Bhargava et al. | |
| 9,482,442 B1* | 11/2016 | Mengle | F24F 11/006 |
| 2007/0273307 A1 | 11/2007 | Westrick, Jr. et al. | |
| 2008/0036591 A1 | 2/2008 | Ray | |
| 2008/0177678 A1 | 7/2008 | Di Martini et al. | |
| 2009/0195349 A1 | 8/2009 | Frader-Thompson et al. | |
| 2010/0082169 A1 | 4/2010 | Crist et al. | |
| 2010/0156665 A1 | 6/2010 | Krzyzanowski et al. | |
| 2010/0286937 A1* | 11/2010 | Hedley | G06Q 30/02 702/60 |
| 2011/0185203 A1 | 7/2011 | Carlson et al. | |
| 2011/0290893 A1 | 12/2011 | Steinberg | |
| 2012/0054125 A1 | 3/2012 | Clifton et al. | |
| 2012/0086562 A1 | 4/2012 | Steinberg | |
| 2012/0131504 A1 | 5/2012 | Fadell et al. | |
| 2012/0191257 A1 | 7/2012 | Corcoran et al. | |
| 2012/0215369 A1 | 8/2012 | Desai et al. | |
| 2012/0286723 A1 | 11/2012 | Ukita et al. | |
| 2012/0316808 A1 | 12/2012 | Frader-Thompson et al. | |
| 2013/0144445 A1 | 6/2013 | Steinberg | |
| 2013/0218360 A1 | 8/2013 | Najewicz et al. | |
| 2013/0262197 A1 | 10/2013 | Kaulgud et al. | |
| 2014/0039690 A1 | 2/2014 | Steinberg | |
| 2014/0070959 A1 | 3/2014 | Bhargava et al. | |
| 2014/0074257 A1 | 3/2014 | Bhargava et al. | |
| 2014/0084165 A1 | 3/2014 | Fadell et al. | |
| 2014/0118148 A1* | 5/2014 | Edlund | G08B 21/0423 340/573.1 |
| 2014/0136242 A1 | 5/2014 | Weekes et al. | |
| 2014/0156028 A1 | 6/2014 | Subramaniam et al. | |
| 2014/0191575 A1 | 7/2014 | Gaucher et al. | |
| 2014/0201315 A1 | 7/2014 | Jacob et al. | |
| 2014/0222954 A1* | 8/2014 | Vaccari | H04L 67/26 709/217 |
| 2014/0229018 A1 | 8/2014 | Steinberg | |
| 2014/0266669 A1 | 9/2014 | Fadell et al. | |
| 2014/0278051 A1* | 9/2014 | McGavran | G01C 21/00 701/400 |
| 2015/0025698 A1* | 1/2015 | Strelec | G06Q 50/06 700/291 |
| 2015/0074228 A1 | 3/2015 | Drake | |
| 2015/0081118 A1 | 3/2015 | Endrizzi et al. | |
| 2015/0168001 A1 | 6/2015 | Steinberg | |
| 2015/0168002 A1 | 6/2015 | Plitkins et al. | |
| 2015/0168003 A1 | 6/2015 | Stefanski et al. | |
| 2015/0222517 A1* | 8/2015 | McLaughlin | H04L 67/303 713/156 |
| 2015/0223416 A1 | 8/2015 | Eng et al. | |
| 2015/0262132 A1 | 9/2015 | Miller et al. | |
| 2015/0308084 A1 | 10/2015 | Thompson et al. | |
| 2015/0308706 A1 | 10/2015 | Bunker et al. | |
| 2015/0323915 A1 | 11/2015 | Warren et al. | |
| 2015/0350031 A1* | 12/2015 | Burks | H04L 41/22 715/736 |
| 2015/0351145 A1* | 12/2015 | Burks | G08C 17/02 455/41.3 |
| 2016/0091871 A1 | 3/2016 | Marti et al. | |
| 2016/0091872 A1 | 3/2016 | Marti et al. | |
| 2016/0091879 A1 | 3/2016 | Marti et al. | |
| 2016/0132030 A1 | 5/2016 | Marti et al. | |
| 2016/0161310 A1 | 6/2016 | Leaders et al. | |
| 2016/0224033 A1* | 8/2016 | Gingrich | G05B 23/02 |
| 2017/0070842 A1 | 3/2017 | Kulp et al. | |
| 2017/0222894 A1 | 8/2017 | Park et al. | |

OTHER PUBLICATIONS

Mozer, Michael C., "Chapter 12 Lessons from an Adaptive Home," Smart Environments: Technologies, Protocols, and Applications, Published Online, Jan. 28, 2005, 15 pages.

Schweizer, D., "Learning Frequent and Periodic Usage Patterns in Smart Homes," Jan. 31, 2014, Master Thesis, University of Applied Sciences and Arts Northwestern Switzerland School of Business, 133 pages.

Iglesias, Felix, et al., "A Global Approach of Habit Profiles for Smart Home Control," Proceedings of BS2013, 13$^{th}$ Conference of International Building Performance Simulation Association, Chambery, France, Aug. 26-28, 2013, 8 pages.

Chen, Yi-Cheng, et al., "Significant Correlation Pattern Mining in Smart Homes," Association for Computing Machinery, May 20, 2015, [online], [retrieved from the internet], <URL: dl.acm.org/citation.cfm?id=2700484>, 20 pages.

Chen, Yi-Cheng, et al., "Mining Correlation Patterns among Appliances in Smart Home Environment," PAKDD 2014, Part II, LNAI 8444, pp. 222-233.

Jakkula, Vikramaditya, et al., "Temporal Pattern Discovery for Anomaly Detection in a Smart Home," Proceedings of the 3rd IET Conference on Intelligent Environments (IE 2007), 2007, pp. 339-345.

Fatima, Iram, et al., "A Unified Framework for Activity Recognition-Based Behavior Analysis and Action Prediction in Smart Homes," Sensors, 2013, vol. 13, pp. 2682-2699.

Chen, Chao, et al., "Energy Outlier Detection in Smart Environments," Artificial Intelligence and Smarter Living—The Conquest of Complexity, Papers from the 2011 AAAI Workshop (WS-11-07), 6 pages.

* cited by examiner

MONITORING OF RESOURCE CONSUMPTION PATTERNS IN AN AUTOMATED ENVIRONMENT INCLUDING DETECTING VARIANCE IN RESOURCE CONSUMPTION

CROSS-REFERENCES TO RELATED APPLICATIONS

This application claims the benefit of U.S. Provisional Application No. 62/057,747, filed Sep. 30, 2014, the disclosure of which is incorporated by reference in its entirety.

The present disclosure is related to the following commonly-owned applications: U.S. Provisional Application No. 62/057,724, filed Sep. 30, 2015, the disclosure of which is incorporated by reference in its entirety. The present disclosure is also related to the following commonly-owned applications: U.S. patent application Ser. No. 14/614,914, filed Feb. 5, 2015 (Published as 2015/0222517); U.S. patent application Ser. No. 14/725,891, filed May 29, 2015; U.S. patent application Ser. No. 14/725,912, filed May 29, 2015; and U.S. patent application Ser. No. 14/081,895, filed Nov. 15, 2013 (published as 2014/0278051), the disclosures of which are incorporated by reference in their entirety.

BACKGROUND

The present disclosure relates in general to an accessory management system and in particular to an automated environment that can monitor resource consumption patterns.

Electronic devices are becoming increasingly popular in a range of applications. Mobile phones, tablet computers, home entertainment systems, and the like are just some of the electronic devices users interact with regularly.

Another category of electronic devices that is becoming more popular includes various electronically controllable devices, such as thermostats, lighting devices, household appliances, etc. It is sometimes desirable to automate operation of such devices.

SUMMARY

An automated environment can allow users' mobile devices (and/or other "controllers") to control various other devices (referred to as "accessories") in the automated environment. The user can interact with an accessory by operating a controller that can communicate message to the accessory in response to user input. In some instances, accessory operation can be automated. For example, a controller can be programmed to automatically instruct an accessory to initiate a specific action when certain triggering conditions are met, such as turning on a heating system or changing a thermostat's target temperature at a particular time, or turning on a light if the controller detects an ambient light level below a threshold. One or more controller devices can also act as a "coordinator" to manage communications between multiple controllers and multiple accessories.

Certain embodiments of the present invention relate to systems and methods that can operate in an automated environment to monitor resource consumption by the automated environment. In some embodiments, resource consumption can be monitored using a sparse set of sensors that can provide environment-level information about the total resource consumption of the automated environment (e.g., an electric meter, water meter, gas meter, or the like). The sensors need not provide any information about which components of the automated environment (e.g., specific appliances or taps in a house) consumed the resource. The sensors can communicate resource-consumption data to an electronic device in the automated environment (referred to herein as a "monitoring device"). The monitoring device can also obtain information about behavior patterns, also referred to as "routines," of users in the automated environment. By performing pattern-detection analysis on the resource consumption data and the user routines together, the monitor device can define a baseline resource consumption pattern for the automated environment. With the baseline resource consumption pattern established, the monitor device can detect anomalies in subsequent resource consumption, where an anomaly can be a deviation from the baseline pattern that is not explained by a deviation from the user routine. The monitor device can report a detected anomaly to a user in the automated environment (e.g., a homeowner or other resident of a home). This can help the user identify and correct faults that may be present in various appliances in a home (or other environment), even in scenarios where those appliances are not communicably connected into the automated environment. For instance, if a user knows that anomalous water consumption is occurring in the home, the user can check water-consuming appliances in the home (e.g., toilets, sink faucets) for leaks. In some instances, the monitoring device can have more detailed information about appliances in the environment and can use this information to provide more specific guidance in identifying the source of an anomaly.

The following detailed description together with the accompanying drawings will provide a better understanding of the nature and advantages of the present invention.

DETAILED DESCRIPTION

Certain embodiments of the present invention relate to systems and methods that can operate in an automated environment to monitor resource consumption by the automated environment. In some embodiments, resource consumption can be monitored using a sparse set of sensors that can provide environment-level information about the total resource consumption of the automated environment (e.g., an electric meter, water meter, gas meter, or the like). The sensors need not provide any information about which components of the automated environment (e.g., specific appliances or taps in a house) consumed the resource. The sensors can communicate resource-consumption data to an electronic device in the automated environment (referred to herein as a "monitoring device"). The monitoring device can also obtain information about behavior patterns, also referred to as "routines," of users in the automated environment. By performing pattern-detection analysis on the resource consumption data and the user routines together, the monitor device can define a baseline resource consumption pattern for the automated environment. With the baseline resource consumption pattern established, the monitor device can detect anomalies in subsequent resource consumption, where an anomaly can be a deviation from the baseline pattern that is not explained by a deviation from the user routine. The monitor device can report a detected anomaly to a user in the automated environment (e.g., a homeowner or other resident of a home). This can help the user identify and correct faults that may be present in various appliances in a home (or other environment), even in scenarios where those appliances are not communicably connected into the automated environment. For instance, if a user knows that anomalous water consumption is occurring in the home, the user can check water-consuming appliances in the home (e.g., toilets, sink faucets) for leaks. In some instances, the monitoring device can have more detailed information about appliances in the environment and can use this information to provide more specific guidance in identifying the source of an anomaly.

To provide context for understanding the present invention, example implementations of an automated environment and a system that can determine a user's established routine and detect patterns of accessory interaction will be described. Thereafter, specific examples of resource consumption monitoring will be described.

I. Example Environment

Figure 1:
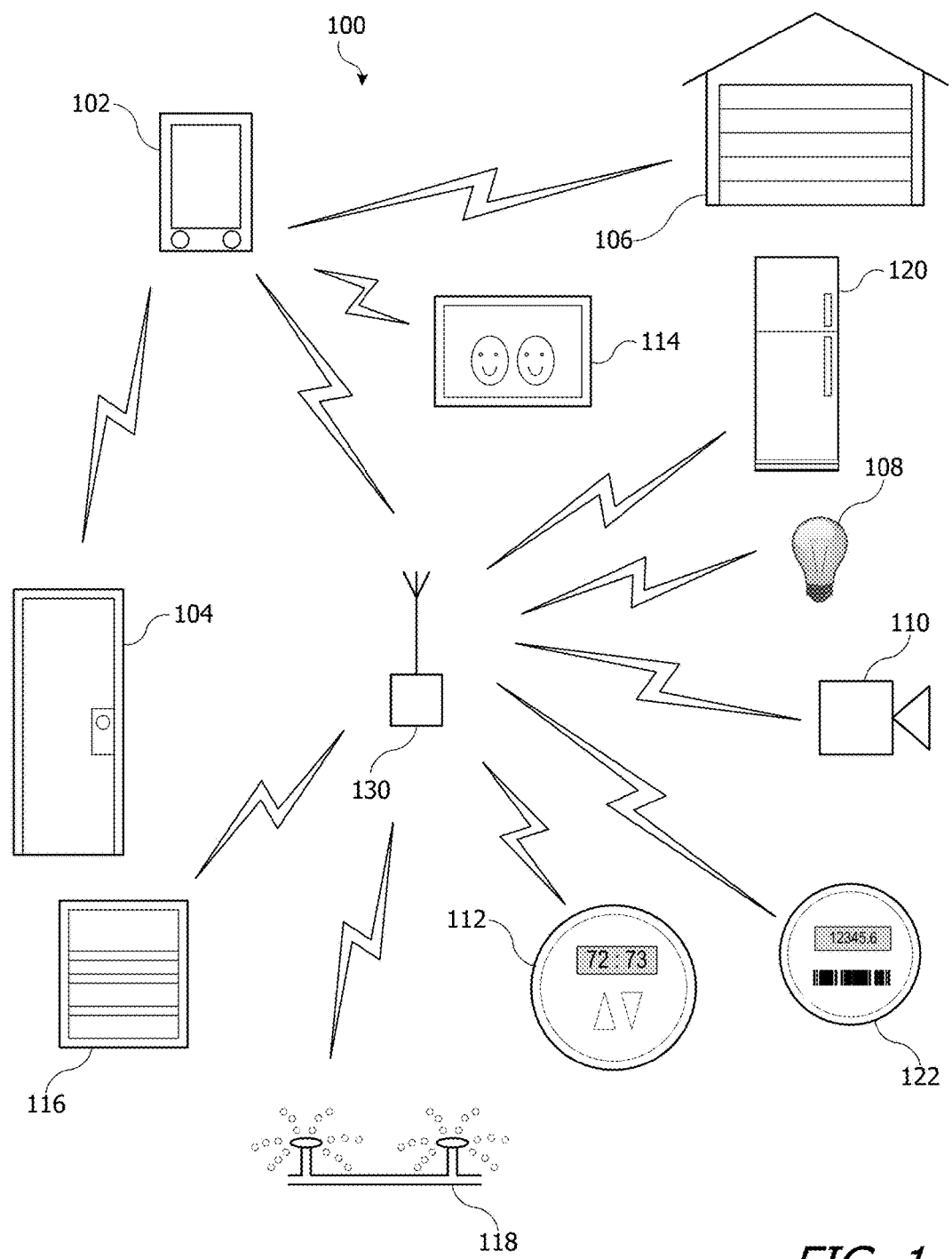
FIG. 1 shows a home environment according to an embodiment of the present invention.

FIG. 1 shows a home environment 100 according to an embodiment of the present invention. Home environment 100 includes a controller 102 that can communicate with various accessory devices (also referred to as accessories) located in the environment. Controller 102 can include, for example, a desktop computer, laptop computer, tablet computer, smart phone, wearable computing device, personal digital assistant, or any other computing device or set of devices that is capable of communicating command-and-control messages to accessories (e.g., as described in above-referenced U.S. patent application Ser. No. 14/614,914) and presenting a user interface to allow a user to indicate desired operations on the accessories. In some embodiments, controller 102 can be implemented using multiple discrete devices. For example, there can be a base station that communicates with accessories and that can be installed in a fixed location in home environment 100, and one or more mobile remote-control stations (e.g., a handheld or wearable device such as a mobile phone, tablet computer, smart watch, eyeglasses, etc.) can provide a user interface and communicate with the base station to effect control over accessories. In some embodiments, the base station can function as a coordinator or proxy for the accessories, e.g., as described below.

As used herein, an "accessory" can be any device or thing located in an environment that is controllable (at least to some degree) by a controller such as controller 102. Examples of accessory devices in a home environment can include door lock 104, garage door system 106, light fixture 108, security camera 110, thermostat 112, TV 114, window 116, sprinkler system 118, household appliance (e.g., refrigerator) 120, and utility meter (e.g., electric meter) 122. In some instances, controller 102 can communicate directly with an accessory; for instance, controller 102 is shown communicating directly with door lock 104, garage door system 106, and TV 114. In other instances, controller 102 can communicate via an intermediary. For instance, controller 102 is shown communicating via a wireless network access point 130 with accessories 108, 110, 112, 116, 118, 120, 122 that are on a wireless network provided by access point 130. As noted above, in some embodiments, controller 102 can include a base station, and base station functionality can be integrated into access point 130 or into one of the accessories that is to be controlled (e.g., thermostat 112). In some embodiments, a base station can function as a proxy or coordinator as described below.

Various communication transports and combinations of transports can be used, and different transports can be used with different devices. For example, some wireless transports such as Bluetooth® transports (e.g., Bluetooth Classic, Bluetooth LE, and other transports conforming to standards promulgated by Bluetooth SIG, Inc., headquartered in Kirkland, Wash.) can support direct point-to-point communication between devices within a limited range. Other wireless transports such as Wi-Fi® transports (conforming to standards promulgated by Wi-Fi Alliance, headquartered in Austin, Tex.) can define a wireless network with a central access point that routes communications between different devices on the network. Further, while wireless communication transports are shown, wired transports can also be provided for some or all of the accessories. For example, light fixture 108 can be connected to access point 130 by a wired connection, and controller 102 can communicate with light fixture 108 by sending messages wirelessly to access point 130, which can deliver the messages to light fixture 108 via the wired connection. Other combinations of wired and wireless communication are also possible.

Further, while one controller 102 is shown, a home environment can have multiple controller devices. For example, each person who lives in the home may have his or her own portable device (or devices) that can act as a controller for some or all of accessories 104-122. Different controller devices can be configured to communicate with different subsets of the accessories; for example, a child's controller might be blocked from modifying settings on thermostat 112, while a parent's controller device is permitted to modify the settings. Such permissions can be configured and controlled, for example, as described in above-referenced U.S. patent application Ser. Nos. 14/725,891 and 14/725,912.

In some embodiments, a universal accessory protocol can facilitate communication by a controller 102 with one or more accessories 104-122. The protocol can provide a simple and extensible framework that models an accessory as a collection of services, with each service being defined as a set of characteristics, each of which has a defined value at any given time. Various characteristics can represent various aspects of the accessory's state. For example, in the case of thermostat 112, characteristics can include power (on or off), current temperature, and target temperature. Examples of an accessory model based on services and characteristics are described in above-referenced U.S. patent application Ser. No. 14/614,914.

The protocol can further define message formats for controller 102 to send command-and-control messages (requests) to accessory 112 (or other accessories) and for accessory 112 to send response messages to controller 102.

The command-and-control messages can allow controller 102 to interrogate the current state of accessory characteristics and in some instances to modify the characteristics (e.g., modifying the power characteristic can turn an accessory off or on). Accordingly, any type of accessory, regardless of function or manufacturer, can be controlled by sending appropriate messages, and the message format can be the same across different accessories. Examples of message formats are described in above-referenced U.S. patent application Ser. No. 14/614,914.

The protocol can further provide notification mechanisms that allow accessory 112 (or other accessories) to selectively notify controller 102 in the event of a state change. Multiple mechanisms can be implemented, and controller 102 can register, or subscribe, for the most appropriate notification mechanism for a given purpose. Examples of notification mechanisms are described in above-referenced U.S. patent application Ser. No. 14/614,914.

In some embodiments, communication with a given accessory can be limited to authorized controllers. The protocol can specify one or more mechanisms (including mechanisms referred to herein as "pair setup" and "pair add") for establishing a "pairing" between controller 102 and a given accessory (e.g., door lock accessory 104) under circumstances that provide a high degree of confidence that the user intends for controller 102 to be able to control accessory 104. Pair setup can include an out-of-band information exchange (e.g., the user can enter a numerical or alphanumeric PIN or passcode provided by accessory 104 into an interface provided by controller 102) to establish a shared secret. This shared secret can be used to support secure exchange of "long-term" public keys between controller 102 and accessory 104, and each device can store the long-term public key received from the other (e.g., in a secure storage element), so that an established pairing can be persistent. After a pairing is established, controller 102 is considered authorized, and thereafter, controller 102 and accessory 104 can go in and out of communication as desired without losing the established pairing. When controller 102 attempts to communicate with or control accessory 104, a "pair verify" process can first be performed to verify that an established pairing exists (as would be the case, e.g., where controller 102 previously completed pair setup with accessory 104). The pair verify process can include each device demonstrating that it is in possession of a long-term private key corresponding to the long-term public key that was exchanged during pair setup and can further include establishing a new shared secret or session key to encrypt all communications during a "pair-verified" session, (also referred to herein as a secure session). During a pair-verified session, a controller that has appropriate privileges can perform a "pair add" process to establish another pairing with the accessory on behalf of another controller. Either device can end a pair-verified session at any time simply by destroying or invalidating its copy of the session key.

In some embodiments, multiple controllers can establish a pairing with the same accessory (e.g., by performing pair setup or by having a pairing added by a controller that previously performed pair setup), and the accessory can accept and respond to communications from any of its paired controllers while rejecting or ignoring communications from unpaired controllers. Examples of pair setup, pair add and pair verify processes, as well as other examples of security-related operations, are described in above-referenced U.S. patent application Ser. No. 14/614,914.

It will be appreciated that home environment 100 is illustrative and that variations and modifications are possible. Embodiments of the present invention can be implemented in any environment where a user wishes to control one or more accessory devices using a controller device, including but not limited to homes, cars or other vehicles, office buildings, campuses having multiple buildings (e.g., a university or corporate campus), etc. A single controller can establish pairings with any number of accessories and can selectively communicate with different accessories at different times. Similarly, a single accessory can be controlled by multiple controllers with which it has established pairings. Any function of an accessory can be controlled by modeling the function as a service having one or more characteristics and allowing a controller to interact with (e.g., read, modify, receive updates) the service and/or its characteristics. Accordingly, protocols and communication processes used in embodiments of the invention can be "universal," meaning that they can be applied in any context with one or more controllers and one or more accessories regardless of accessory function or controller form factor or specific interfaces.

II. Example Accessory and Controller Network

For purposes of implementing an automated environment, it is desirable to allow accessories to be controlled by multiple controllers and to allow one controller to control multiple accessories. Accordingly, accessories and/or controllers can be connected into accessory networks and controller networks. This can be done, for instance, by establishing pairings between various accessories and various controllers and providing a security protocol such that an accessory only responds to a controller if a pairing has been established. Examples of establishing pairings and associated security protocols are described in above-referenced U.S. patent application Ser. Nos. 14/614,914; 14/725,891; and 14/725,912.

Figure 2:
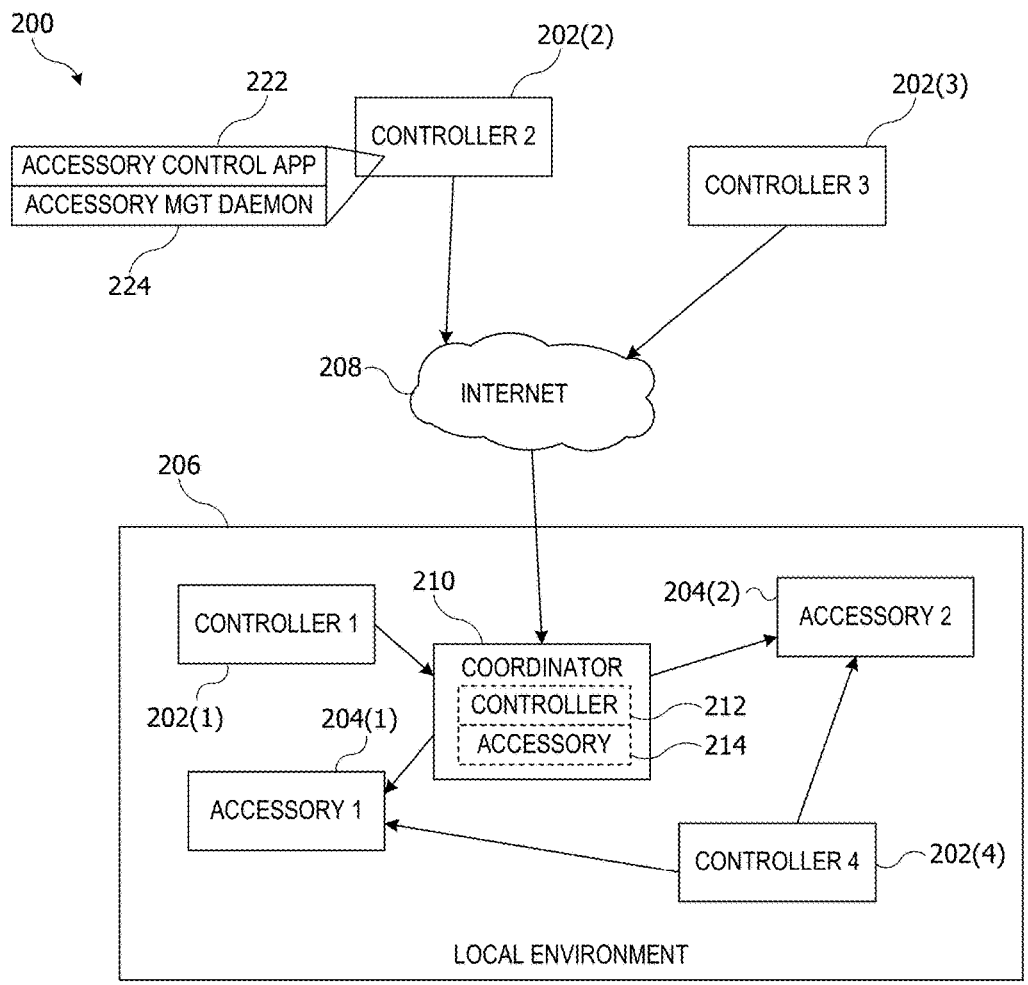
FIG. 2 shows an example of a network configuration according to an embodiment of the present invention.

In some embodiments, an automated environment can include a "coordinator" device that can act as an intermediary or proxy between controllers and accessories. FIG. 2 shows an example of a network configuration 200 according to an embodiment of the present invention that allows multiple controllers 202 to interact with multiple accessories 204 in a local environment 206. While two accessories and four controllers are shown, it is to be understood that any number of controllers and/or accessories can be included.

Controllers 202(1)-202(4) can each be similar to controller 102 of FIG. 1. For example, each controller 202 can be a mobile device (e.g., a mobile phone or wearable device). Accessories 204(1) and 204(2) can be similar to any of accessories 104-122 of FIG. 1 and can be any devices located in a "local environment" 206 (e.g., a home environment). For purposes of description, it is assumed that accessories 204 remain in local environment 206, while controllers 202, being mobile devices, can be sometimes within and sometimes outside local environment 206.

In this example, controllers 202(1) and 202(4) are currently located in local environment 206 with accessories 204(1) and 204(2). For example, controllers 202(1), 202(4), and accessories 204(1), 204(2) can be on the same local area network (LAN), such as a Wi-Fi network or within Bluetooth communication range or the like. Controllers 202(2) and 202(3) are currently located outside local environment 206 but are connected to a wide-area communication network 208 (e.g., the Internet); such controllers are said to be "remote" from accessories 204. In this example, it is assumed that accessories 204 can communicate only within local environment 206 and are not directly connected to wide-area communication network 208. Thus, communication between controller 202(2) or 202(3) with accessories 204 would proceed through an indirect path.

A "coordinator" 210 can be a device that facilitates communication between remote controllers 202(2), 202(3) and accessories 304(1) and 304(2). Coordinator 210 can be any electronic device that is present in local environment 206 and capable of communicating with accessories 204. For example, coordinator 210 can be a mobile device that happens to be in local environment 206. As another example, coordinator 210 can be a device that is expected to stay in local environment 206 and that is expected to be powered on and available for communication most or all of the time. (It is to be understood that coordinator 210 can occasionally be unavailable, e.g., in connection with software or firmware upgrades, power outages, or other intermittent occurrences.) For example, coordinator 210 can be implemented in a desktop computer, a network access-point unit, a dedicated accessory-control base station, a set-top box for a television or other appliance (which can implement coordinator and/or other base station functionality in addition to interacting with the television or other appliance), or any other electronic device as desired.

In some embodiments, coordinator 210 can act as a relay or proxy between controllers 202 and accessories 204. Thus, for example, coordinator 210 can present itself to controllers 202 as a virtual accessory 214 and to accessories 204 as a virtual controller 212. In operation, a controller, e.g., controller 202(2), can establish a secure communication session with coordinator 210 and send a message to coordinator 210 indicating that it wishes to communicate with an accessory in local environment 206, e.g., accessory 204(1). Coordinator 210 can establish a secure communication session with accessory 204(1) and use that session to relay messages between controller 202(2) and accessory 204(1). For example, through the relay, controller 202(2) can establish its own secure session with accessory 204(1), then send control messages and receive responses within the secure session. In some embodiments, coordinator 210 can pass the messages back and forth (optionally adding its own authenticated signature or encryption layer) while remaining agnostic to their content. Examples of such operations are described in above-referenced U.S. patent application Ser. Nos. 14/725,891 and 14/725,912.

In some embodiments, controllers 202 can prefer to communicate with accessories 204 via coordinator 210 whenever coordinator 210 is available. Thus, for example, controller 202(1), which is in local environment 206, can communicate with coordinator 210 rather than directly with accessories 204. Remotely located controllers 202(2) and 202(3) do not have direct communication with accessories 204 and also communicate via coordinator 210. Alternatively, controllers 202 can communicate directly with accessories 204 when in local environment 206, e.g., as shown for controller 202(4). Any combination of direct and/or indirect communication with accessories can be supported.

Where a controller-coordinator pairing and one or more coordinator-accessory pairings are established, coordinator 210 can present itself to controllers 202 as an "accessory network" via which controller 202 can access all the services of all accessories 204 with which coordinator 210 has an established pairing. For instance, coordinator 210 can present an accessory network modeled as a "home" or other environment. The model can define various physical and/or logical groupings of accessories that can be controlled in a coordinated manner. Controllers 202 can operate any accessory in the network by interacting with coordinator 210. In some instances, operation of particular accessories by particular controllers can be restricted using a system of permissions.

In some embodiments, coordinator 210 can operate as an intelligent agent for allowing controllers 202 to operate accessories 204, rather than simply relaying messages as described above. For example, when controller 202(1) receives a user request to interact with accessory 204(1), controller 202(1) can provide instructions for accessory 204(1) to coordinator 210. Coordinator 210 can receive the instructions, establish a communication session with accessory 204(1) and send appropriate control messages to accessory 204(1). In some embodiments, the messages sent to accessory 204(1) need not correspond to the instructions provided by controller 202(1). For example, while communicating with controller 202(1), coordinator 210 may also be in communication with another controller (e.g., controller 202(2)). Controllers 202(1) and 202(2) may each provide instructions for accessory 204(1) to coordinator 210. Coordinator 210 can analyze the received instructions, e.g., to detect and resolve conflicts such as where controller 202(1) instructs coordinator 210 to turn accessory 204(1) on while controller 202(2) instructs coordinator 210 to turn accessory 204(1) off. Coordinator 210 can be programmed with priority rules or other rules for resolving conflicts (e.g., "on" takes priority over "off"; instructions from controller 202(1) take priority over instructions from controller 202(2); etc.). Coordinator 210 can apply the priority rule to resolve any conflicts and can communicate instructions to accessory 204(1) based on the resolution. When a response is received from accessory 204(1), coordinator 210 can determine whether to send a corresponding message (or a different message) to controller 202(1) and/or to controller 202(2). Thus, coordinator 210 is not limited to acting as a passive relay for messages between controllers and accessories but can actively intervene to resolve conflicting instructions, enforce any limitations that may exist on the privileges or permissions granted to particular controllers or users, and so on. Further examples of operation of a coordinator such as coordinator 210 are described in above-referenced U.S. patent application Ser. Nos. 14/725,891 and 14/725,912.

From a user's perspective, operation of controller 202(2) to control accessories 204 can be the same regardless of whether the connection to accessories 204 is direct or through coordinator 210. For example, as shown for controller 202(2), any of controllers 202 can execute an accessory-control application 222 that generates a user interface (such as a graphical user interface) for controlling any of accessories 204, e.g., accessory 204(1). The interface can include display elements to display current settings of accessory 204, user-operable controls to change some or all of the settings, etc. Accessory-control application 222 can interact with an operating-system process 224 (referred to herein as an "accessory management daemon") that manages the communication between controller 202(2) and accessory 204(1). Accessory management daemon 224 can present an application program interface (API) to application 222 in a manner that is transport-agnostic, so that application 222 can, for instance, invoke an API function indicating that a message should be sent to accessory 204(1). Accessory management daemon 224 can, transparently to the user, create either a direct or indirect (e.g., through coordinator 210) communication path to accessory 204(1) and send the message. In some embodiments, accessory management daemon 224 can also handle operations such as pair verify and encryption/decryption of communications within a pair-verified session, transparently to application 222.

Network configuration 200 can support automated operation of accessories 204. For example, any of controllers 202 or coordinator 210 can execute program code that sends control messages to one or more of accessories 204 upon the occurrence of certain triggering conditions, such as a particular time of day or a particular user action (e.g., user leaving the house). The control messages can instruct the accessory to initiate an action. Thus, for example, a thermostat accessory (e.g., accessory 112 of FIG. 1) can be instructed to heat (or cool) the house to a desired temperature at a particular time based on the user's expected arrival, or to turn off the heat (or cooling) when the user leaves. A user leaving (or entering) local environment 206 can be detected using various techniques. For example, controller 202(1) (or any other controller 202) can be a mobile device that the user habitually wears or carries wherever he or she goes and that automatically connects to a wireless local area network (e.g., a home-based Wi-Fi network) when it is within signal range of the network. When controller 202(1) disconnects from the network (and remains disconnected for a minimum time), coordinator 210 (or another device that is resident in local environment 206) can detect the disconnection and infer that the user has left local environment 206. Similarly, when controller 202(1) subsequently reconnects, coordinator 210 can infer that the user has returned to local environment 206. Any other information available to coordinator 210 can be used, including input from presence or proximity sensors that may be installed in local environment 206, location data provided by the user's controller 202(1), inferences from user interactions with particular accessories, and so on.

It will be appreciated that network configuration 200 is illustrative and that variations and modifications are possible. Any number of controllers can establish pairings with an accessory, and each controller can be any type of electronic device that supports user interaction (e.g., through a local or remote user interface) and that can communicate with other devices via wired and/or wireless channels. Examples include mobile phones, tablets, wearable devices, laptop computers, desktop computers, dedicated accessory-control base stations, and so on. The accessory can be any electronic device that has a controllable function and that is capable of communicating with other devices via wired and/or wireless interfaces. Examples include lamps (or lights), fans, thermostats, appliances (refrigerator, oven, dishwasher, clothes washer, clothes dryer, vacuum cleaner, etc.), door locks, door openers, media storage and/or playback devices (TV, cable or satellite television interface unit, DVD player, digital video recorder, digital music player, streaming media device, etc.), utility meters (e.g., water, electric, and/or gas meters that can be read by a controller), irrigation systems (e.g., sprinklers, drip irrigation), and so on.

III. Example Devices

Figure 3:
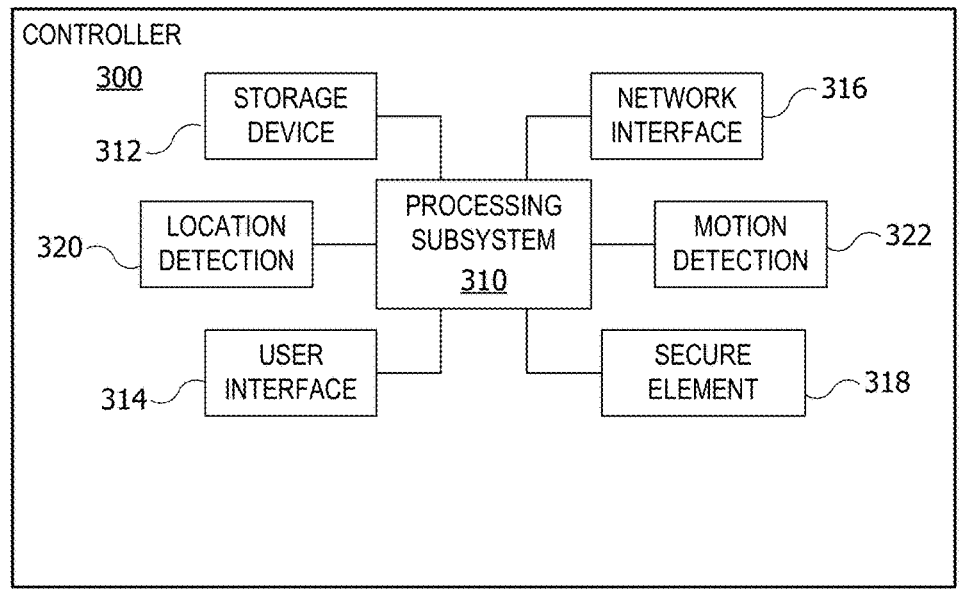
FIG. 3 is a simplified block diagram of a controller according to an embodiment of the present invention.

FIG. 3 is a simplified block diagram of a controller 300 according to an embodiment of the present invention. Controller 300 can implement any or all of the controller functions, behaviors, and capabilities described herein, as well as other functions, behaviors, and capabilities not expressly described. Controller 300 can include processing subsystem 310, storage device 312, user interface 314, network interface 316, secure element 318, location detection element 320, and motion detection element 322. Controller 300 can also include other components (not explicitly shown) such as a battery, power controllers, and other components operable to provide various enhanced capabilities. In various embodiments, controller 300 can be implemented in a desktop computer, laptop computer, tablet computer, smart phone, wearable computing device, or other systems having any desired form factor. Further, as noted above, controller 300 can be implemented partly in a base station and partly in a mobile unit that communicates with the base station and provides a user interface.

Storage device 312 can be implemented, e.g., using disk, flash memory, or any other non-transitory storage medium, or a combination of media, and can include volatile and/or non-volatile media. In some embodiments, storage device 312 can store one or more application and/or operating system programs to be executed by processing subsystem 310, including programs to implement various operations described herein as being performed by a controller. For example, storage device 312 can store a universal controller application that can read an accessory description record and generate a graphical user interface for controlling the accessory based on information therein (e.g., as described in above-referenced U.S. patent application Ser. No. 14/614, 914). Storage device 312 can also store a "user routine" program that can determine a user routine and detect deviations from that routine (e.g., as described below). In some embodiments, portions (or all) of the controller functionality described herein can be implemented in operating system programs rather than applications. In some embodiments, storage device 312 can also store apps designed for specific accessories or specific categories of accessories (e.g., an IP camera app to manage an IP camera accessory or a security app to interact with door lock accessories).

User interface 314 can include input devices such as a touch pad, touch screen, scroll wheel, click wheel, dial, button, switch, keypad, microphone, or the like, as well as output devices such as a video screen, indicator lights, speakers, headphone jacks, or the like, together with supporting electronics (e.g., digital-to-analog or analog-to-digital converters, signal processors, or the like). A user can operate input devices of user interface 314 to invoke the functionality of controller 300 and can view and/or hear output from controller 300 via output devices of user interface 314.

Processing subsystem 310 can be implemented as one or more integrated circuits, e.g., one or more single-core or multi-core microprocessors or microcontrollers, examples of which are known in the art. In operation, processing subsystem 310 can control the operation of controller 300. In various embodiments, processing subsystem 310 can execute a variety of programs in response to program code and can maintain multiple concurrently executing programs or processes. At any given time, some or all of the program code to be executed can be resident in processing subsystem 310 and/or in storage media such as storage device 312.

Through suitable programming, processing subsystem 310 can provide various functionalities for controller 300. For example, in some embodiments, processing subsystem 310 can implement various processes (or portions thereof) described herein as being implemented by a controller. Processing subsystem 310 can also execute other programs to control other functions of controller 300, including application programs that may be stored in storage device 312. In some embodiments, these application programs may interact with an accessory, e.g., by generating messages to be sent to the accessory and/or receiving responses from the accessory.

Such interactions can be facilitated by an accessory management daemon and/or other operating system processes, e.g., as described above.

Network interface 316 can provide voice and/or data communication capability for controller 300. In some embodiments, network interface 316 can include radio frequency (RF) transceiver components for accessing wireless voice and/or data networks (e.g., using cellular telephone technology, data network technology such as 3G, 4G/LTE, Wi-Fi (IEEE 802.11 family standards), or other mobile communication technologies, or any combination thereof), components for short-range wireless communication (e.g., using Bluetooth and/or Bluetooth LE standards, NFC, etc.), and/or other components. In some embodiments, network interface 316 can provide wired network connectivity (e.g., Ethernet) in addition to or instead of a wireless interface. Network interface 316 can be implemented using a combination of hardware (e.g., driver circuits, antennas, modulators/demodulators, encoders/decoders, and other analog and/or digital signal processing circuits) and software components. In some embodiments, network interface 316 can support multiple communication channels concurrently, using the same transport or different transports.

Secure element 318 can be an integrated circuit or the like that implements or supports cryptographic operations of controller 300, including any or all cryptographic operations related to pair setup, pair add, and pair verify. Secure element 318 can appear as a "black box" to the rest of controller 300. Thus, for instance, network interface 316 can receive a message in encrypted form that it cannot decrypt and can simply deliver the message to processing subsystem 310. Processing subsystem 310 may also be unable to decrypt the message, but it can recognize the message as encrypted and deliver it to secure element 318. Secure element 318 can decrypt the message and determine what information to return to processing subsystem 310. As a result, certain information can be available only within secure element 318. If secure element 318 is a single IC that executes code only from its own secure repository, this can make extraction of the information extremely difficult, which can provide a high degree of security. Examples of secure elements are described further in above-referenced U.S. patent application Ser. Nos. 14/725,891 and 14/725,912.

Location detection element 320 can include hardware and/or software components operable to determine a geographical location of controller 300. For example, location detection element 320 can implement a GPS receiver. Other location-determination technologies can also be used, such as Wi-Fi fingerprinting (distinguishing and recognizing locations based on availability and signal strength of various Wi-Fi networks), cellular tower triangulation (based on detecting proximity to different transceiver "cells" in a cellular voice or data network), and so on.

Motion detection element 322 can include hardware and/or software components operable to detect and measure motion of controller 300. For example, motion detection element 322 can include motion sensors such as accelerometers, gyroscopic motion sensors, or the like. In some embodiments, motion detection element 322 can process signals from the motion sensors and infer a specific activity or motion of the controller or a user (e.g., whether the user is riding in a vehicle, walking, running, etc.). In some embodiments, controller 300 can also incorporate other types of environmental sensors, such as ambient light sensors, ambient sound sensors, physiological sensors, etc.

Figure 4:
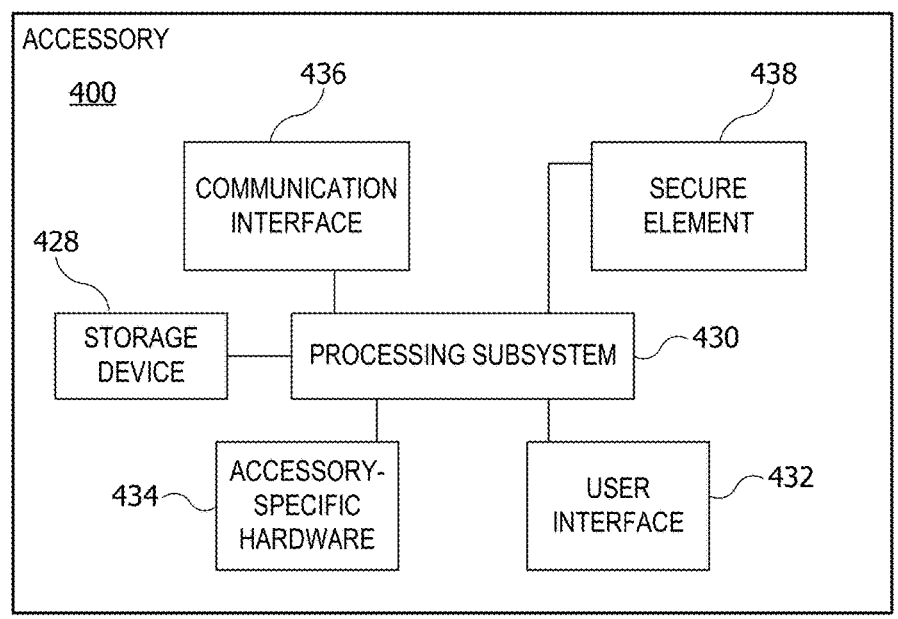
FIG. 4 is a simplified block diagram of an accessory according to an embodiment of the present invention.

FIG. 4 is a simplified block diagram of an accessory 400 according to an embodiment of the present invention. Accessory 400 can implement any or all of the accessory functions, behaviors, and capabilities described herein, as well as other functions, behaviors, and capabilities not expressly described. Accessory 400 can include storage device 428, processing subsystem 430, user interface 432, accessory-specific hardware 434, communication interface 436, and secure element 438. Accessory 400 can also include other components (not explicitly shown) such as a battery, power controllers, and other components operable to provide various enhanced capabilities. Accessory 400 is representative of a broad class of accessories that can be operated by a controller such as controller 300, and such accessories can vary widely in capability, complexity, and form factor. For instance, accessory 400 can implement any of accessories 104-122 of FIG. 1.

Storage device 428 can be implemented, e.g., using disk, flash memory, or any other non-transitory storage medium, or a combination of media, and can include volatile and/or non-volatile media. In some embodiments, storage device 428 can store one or more application programs to be executed by processing subsystem 430, including programs to implement various operations described above as being performed by an accessory, as well as operations related to particular accessory behaviors. Storage device 428 can also store an accessory descriptor record that can be furnished to controller devices, e.g., during device discovery as described in above-referenced U.S. patent application Ser. No. 14/614,914. Storage device 428 can also store accessory state information and any other data that may be used during operation of accessory 400.

Processing subsystem 430 can include, e.g., one or more single-core or multi-core microprocessors and/or microcontrollers executing program code to perform various functions associated with accessory 400. For example, processing subsystem 430 can implement various processes (or portions thereof) described above as being implemented by an accessory, e.g., by executing program code stored in storage device 428. Processing subsystem 430 can also execute other programs to control other functions of accessory 400. In some instances programs executed by processing subsystem 430 can interact with a controller (e.g., controller 300), e.g., by generating messages to be sent to the controller and/or receiving messages from the controller.

User interface 432 may include user-operable input devices such as a touch pad, touch screen, scroll wheel, click wheel, dial, button, switch, keypad, microphone, or the like, as well as output devices such as a video screen, indicator lights, speakers, headphone jacks, or the like, together with supporting electronics (e.g., digital-to-analog or analog-to-digital converters, signal processors, or the like). Depending on the implementation of a particular accessory 400, a user can operate input devices of user interface 432 to invoke functionality of accessory 400. Some accessories may provide a minimal or no user interface.

Accessory-specific hardware 434 can include any other components that may be present in accessory 400 to enable its functionality. For example, in various embodiments, accessory-specific hardware 434 can include one or more storage devices using fixed or removable storage media; GPS receiver; power supply and/or power management circuitry; a camera; a microphone; one or more actuators; control switches; fans; motors; heating elements; valves; position sensors (e.g., position encoders); environmental sensors (e.g., temperature sensor, pressure sensor, accelerometer, chemical sensor, etc.); and so on. It is to be understood that any type of accessory functionality can be supported by providing appropriate accessory-specific hardware 434 and that accessory-specific hardware can include mechanical as well as electrical or electronic components.

Communication interface 436 can provide voice and/or data communication capability for accessory 400. In some embodiments, communication interface 436 can include radio frequency (RF) transceiver components for accessing wireless voice and/or data networks (e.g., using cellular telephone technology, data network technology such as 3G, 4G/LTE, Wi-Fi (IEEE 802.11 family standards), or other mobile communication technologies, or any combination thereof), components for short-range wireless communication (e.g., using Bluetooth and/or Bluetooth LE standards, NFC, etc.), and/or other components. In some embodiments, communication interface 436 can provide wired network connectivity (e.g., Ethernet) in addition to or instead of a wireless interface. Communication interface 436 can be implemented using a combination of hardware (e.g., driver circuits, antennas, modulators/demodulators, encoders/decoders, and other analog and/or digital signal processing circuits) and software components. In some embodiments, communication interface 436 can support multiple communication channels concurrently, using the same transport or different transports.

Secure element 438 can be an integrated circuit or the like that implements or supports cryptographic operations of accessory, including any or all cryptographic operations related to pair setup, pair add, or pair verify. Secure element 438 can operate similarly to secure element 318 in controller 300. Examples of secure elements are described further in above-referenced U.S. patent application Ser. Nos. 14/725,891 and 14/725,912.

Accessory 400 can be any electronic apparatus that interacts with controller 300. In some embodiments, controller 300 can provide control over operations of accessory 400 as described above. For example controller 300 can provide a user interface for accessory 400 that can include both input and output controls (e.g., a display screen to display current state information obtained from accessory 400 and an input control such as a touchscreen overlay to allow the user to initiate changes to the state information, resulting in a change in some attribute of the accessory's state). In various embodiments, controller 300 can control any function of accessory 400 and can also receive data from accessory 400. Further, in some instances, accessory 400 can operate as a coordinator for other accessories, e.g., as described above.

It will be appreciated that the system configurations and components described herein are illustrative and that variations and modifications are possible. The controller and/or accessory may have other capabilities not specifically described herein (e.g., mobile phone, global positioning system (GPS), broadband data communication, Internet connectivity, etc.). Depending on implementation, the devices can interoperate to provide any functionality supported by either (or both) devices or to provide functionality that is partly implemented in each device. In some embodiments, a particular accessory can have some functionality that is not accessible or invocable via a particular controller but is accessible via another controller or by interacting directly with the accessory.

Further, while the controller and accessory are described herein with reference to particular blocks, it is to be understood that these blocks are defined for convenience of description and are not intended to imply a particular physical arrangement of component parts. Further, the blocks need not correspond to physically distinct components. For example, as noted above, coordinator 210 of FIG. 2 can implement both accessory and controller functionality, and the same hardware components can be used for both. Blocks can be configured to perform various operations, e.g., by programming a processor or providing appropriate control circuitry, and various blocks might or might not be reconfigurable depending on how the initial configuration is obtained. Embodiments of the present invention can be realized in a variety of apparatus including electronic devices implemented using any combination of circuitry and software.

IV. Example of Determining a User Routine

As noted above, it may be desirable for a controller (or coordinator) to automate operation of an accessory for the convenience of occupants of an environment where the accessory is located. For example, referring to FIG. 1, it may be desirable to operate thermostat 112 to warm (or cool) home environment 100 to a desired temperature in anticipation of the occupant returning. Or it may be desirable to make sure that TV 114 and light fixture 108 are both switched off when the occupant goes to bed.

While desirable, such automated control is complicated by the reality that most human beings do not adhere to a rigid schedule. Further, many environments have multiple occupants; for instance, a home may be occupied by parents and children, by a group of unrelated housemates, or the like. (The term "family" may be used herein to refer collectively to the occupants of a home, regardless of their particular legal or biological relationship or lack thereof.)

Accordingly, home automation and control can be enhanced based on knowledge of a user routine of various occupants. As used herein, a "user routine" (or just "routine") can refer generally to any pattern of behavior of an individual that can be inferred by an automated machine learning algorithm based on inputs indicative of the individual's location and/or activity at various times over an extended time span. In some embodiments, a user routine can be inferred by a mobile device that an individual habitually wears or carries (e.g., a smart phone or smart watch or the like), based on data automatically collected by the device.

Figure 5:
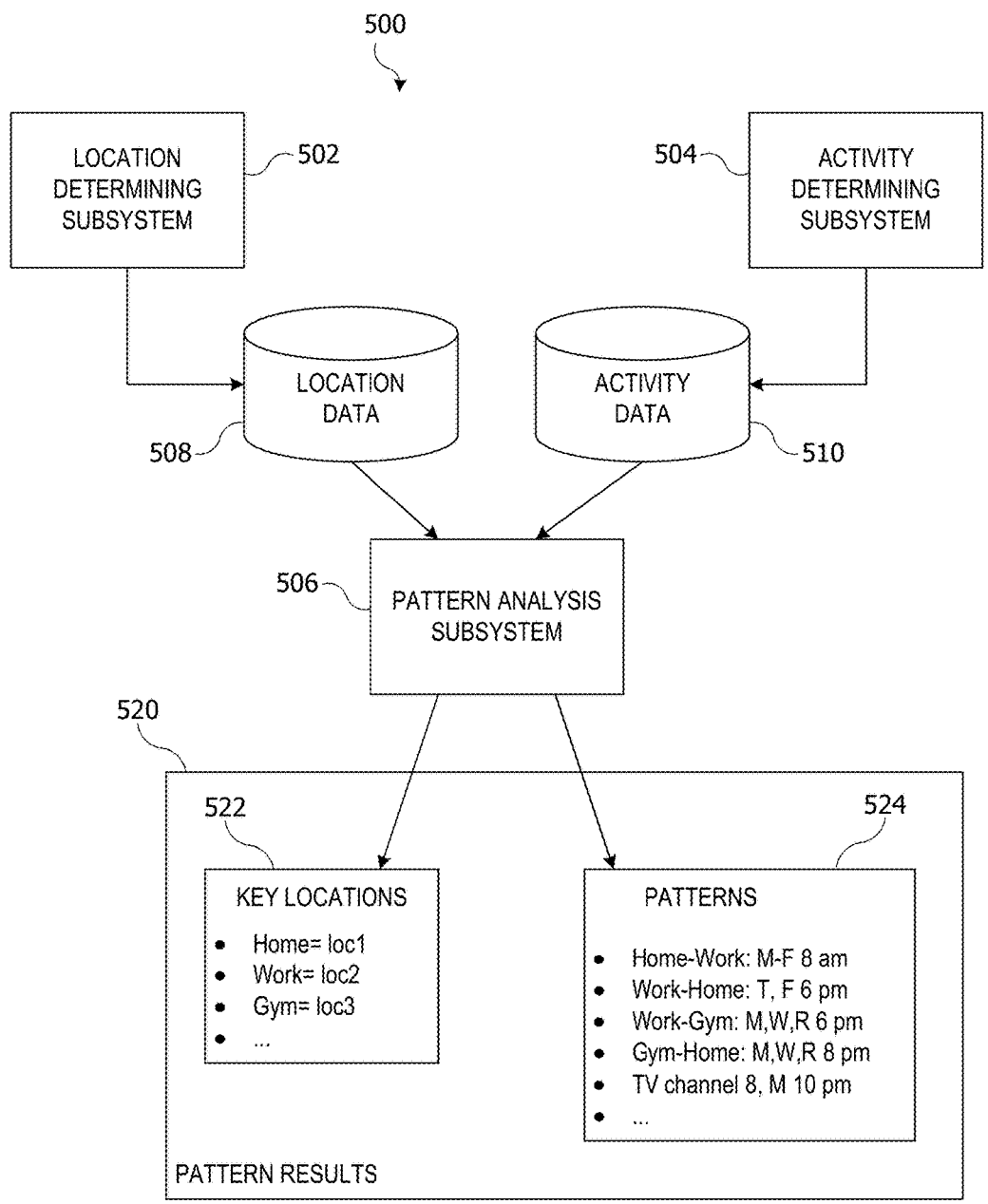
FIG. 5 is a simplified block diagram of a system for determining a user routine that can be used in connection with an embodiment of the present invention.

FIG. 5 is a simplified block diagram of a system 500 for inferring a user routine that can be used in connection with an embodiment of the present invention. System 500 can be implemented in a mobile device such as a smart phone or smart watch, and the same device can also implement a controller as described herein (e.g., controller 300 of FIG. 3, any of controllers 202 of FIG. 2, controller 102 of FIG. 1). System 500 can gather and analyze data pertaining to user location and activity across time and can analyze the data to detect patterns.

System 500 can include a location determining subsystem 502, an activity determining subsystem 504, and a pattern analysis subsystem 506. Location determining subsystem 502 can operate at various times to determine the current location of the device in which system 500 is implemented and can store the location information in location data store 508. For example, location determining subsystem 502 can incorporate a GPS receiver and can activate the GPS receiver from time to time to obtain a location fix (e.g., standard world coordinates representing the location of the device). The location fix, along with a time stamp indicating when the fix was obtained, can be stored in location data store 508. Location determining subsystem 502 can operate on a fixed schedule (e.g., recording location every few minutes) or opportunistically (e.g., recording location data whenever another process in the device requests current location information).

Activity determining subsystem 504 can operate at various times to determine a current activity in which the user is engaged and can store the activity information in activity data store 510. For example, activity determining subsystem 504 can incorporate accelerometers, gyroscopic motion sensors, or other inertial motion sensors that can detect whether and how the device is moving. In some embodiments, activity determining subsystem 504 can determine the user activity based on the motion (e.g., whether the user is running, walking, riding in a vehicle, stationary, or whether the device is at rest on a stable surface such as a tabletop). Like location determining subsystem 502, activity determining subsystem 504 can operate on a regular schedule or opportunistically as desired. In some embodiments, activity determining subsystem 504 can also detect other status information pertaining to the device, such as whether the device is connected to a power source (e.g., a charger) or to a particular auxiliary device (e.g., an automobile head unit, a speaker dock, a specific computer system). This status information can also include information pertaining to user interactions with the device, such as launching a particular app (e.g., workout tracking app, telephony app, media app, remote control app to control accessories as described above) or changing device settings (e.g., enabling or disabling a "do not disturb" function, setting or canceling an alarm, etc.). In some embodiments, the status information can also include elements of the user's personal data that are accessible to the device in which system 500 is implemented, such as calendar data (e.g., scheduled appointments, meetings, and other events) maintained for the user. In general, any information indicative of what a user is doing that can be detected by the device can be included as activity data. Time-stamped activity data can be recorded in activity data store 510.

Through the ongoing operation of location determining subsystem 502 and activity determining subsystem 504, location data store 508 and activity data store 510 can accumulate a collection of location and activity records covering a span of time (e.g., six to eight weeks). The particular time span can be selected as desired, based on considerations such as storage space, the length of a time span needed to detect patterns of activity, and the desire to protect user privacy by not keeping records of user activity indefinitely, while keeping enough data to provide useful pattern results.

Pattern analysis subsystem 506 can periodically (e.g., once a day or once a week or the like) analyze the data accumulated in location data store 508 and activity data store 510 to detect various patterns that may be present. Examples of patterns can include going to particular locations repeatedly, going to a particular location at a similar time each day (e.g., commuting to and from work), using a particular device function while in a particular location (e.g., launching a workout app when at the gym), using a particular device function at a consistent time or in a consistent manner (e.g., setting alarm for 7:00 am, turning off the lights between 10 pm and 11 pm), or the like. Examples of pattern analysis and pattern detection are described in above-referenced U.S. patent application Ser. No. 14/081,895.

Pattern analysis subsystem 506 can output various pattern results 520. For example, pattern results 520 can include a set of "key location" identifiers 522. As used herein, a "key location" can be a location that the user visits regularly and spends significant time at. Examples can include the user's home, the user's place of work, a gym (or other workout space) the user frequents, and so on. In some embodiments, pattern analysis subsystem 506 can generate a list of key locations 522 without semantically labeling them. In other embodiments, pattern analysis subsystem 506 can assign semantic labels to some or all of key locations 522, e.g., based on activity information correlated with the location. For instance, a "home" location can be identified based on activity patterns such as where the device is when it is charged, where the device is left resting on a surface for long periods of time (suggesting that the user is asleep), where the device is when a daily alarm goes off, etc. A "work" location can be identified based on where the user goes most regularly that is not the home location and/or on activity the user does there (e.g., accessing productivity apps). Other locations, such as a gym, store, or the like can also be identified based on activity information (e.g., a "gym" can be any place where a user regularly performs workout activities such as running, cycling, or weightlifting).

Another example of pattern results can be pattern identifiers 524. Pattern identifiers 524 can include transitions between key locations that occur with reasonable regularity, such as the user going from home to work (or vice versa) or from work to the gym (if the user regularly goes to a gym after work). In some embodiments, pattern identifiers 524 can also include patterns of interactions with accessories in a particular location, provided that the device in which system 500 is included can detect the interaction. For instance, upon coming home, the user may operate a remote control app on his or her mobile phone to turn on the TV or select a particular program to watch, and such interactions can be detected and recorded by activity determining subsystem 504.

In some embodiments, pattern results are periodically generated or updated (e.g., on a daily or weekly basis), and previous results can be used to inform the generation of new pattern results. In such cases, it may be useful to retain "old" pattern results for a period of time. This period of time can be limited (e.g., to four months, eight months, etc.), in the interest of protecting user privacy.

It will be appreciated that system 500 is illustrative and that variations and modifications are possible. Determination of a user routine can be implemented in any manner desired, and further examples can be found in above-referenced U.S. patent application Ser. No. 14/081,895. In the interest of protecting user privacy, it may be desirable for system 500 to be implemented entirely within a single device (e.g., the user's mobile phone), such that the location data, activity data, and/or pattern results are not shared with other devices. In addition, it may be desirable to discard location data, activity data, and/or pattern results after a period of time (e.g., several weeks). In some embodiments, some or all of pattern results 520 (including key location identifiers 522 and/or pattern identifiers 524) can be selectively made available to trusted applications on the device in which system 500 is implemented and/or to other trusted devices, e.g., as described below; the raw location data and/or activity data from which pattern results were derived need not be shared.

V. Example of Determining Aggregated Routines

In some embodiments of the present invention, an automated environment can aggregate established user routines across controllers belonging to multiple users who frequent the automated environment. The aggregated routine can provide information that can aid in controlling the automated environment.

Figure 6:
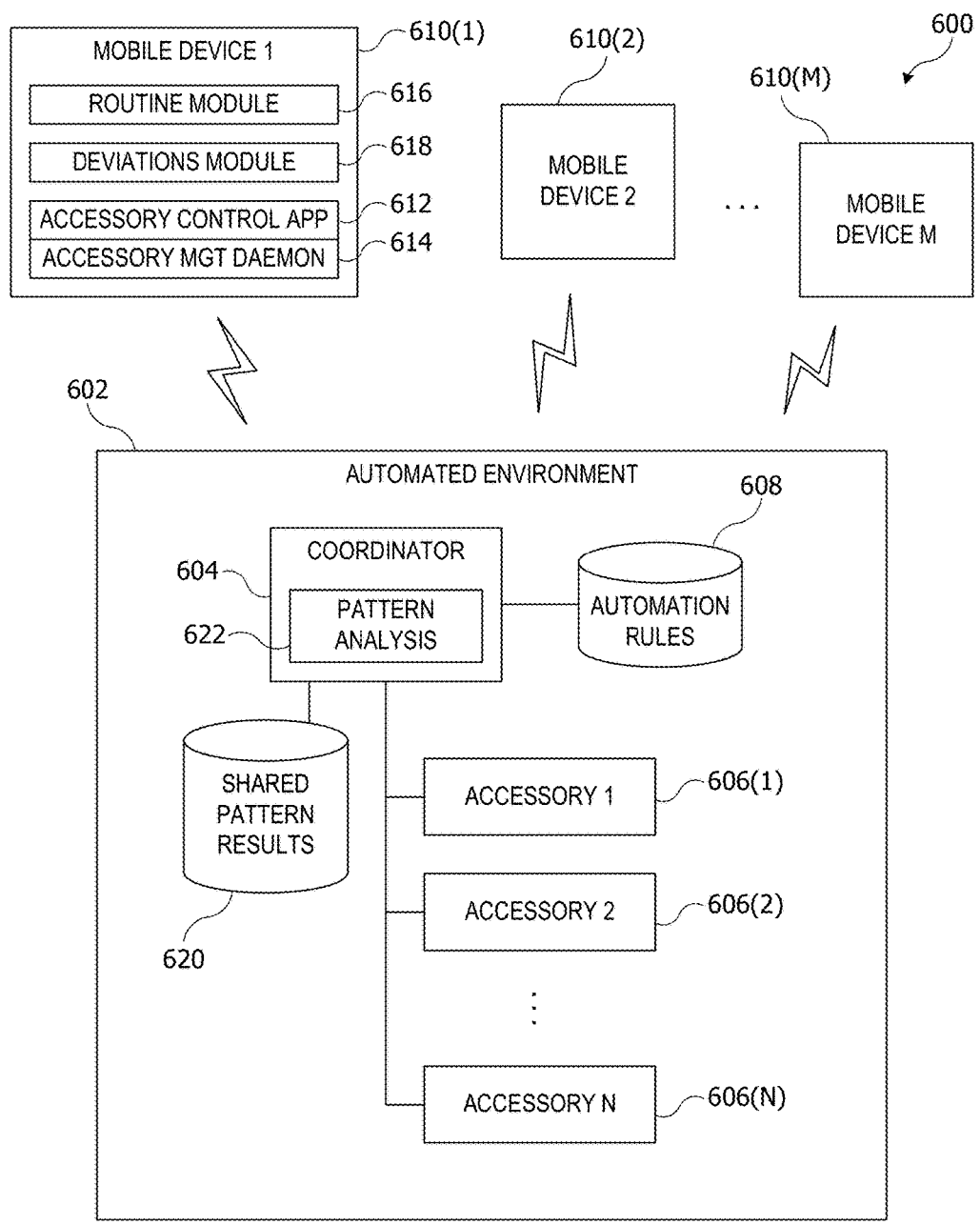
FIG. 6 is a simplified block diagram of a system according to an embodiment of the present invention.

FIG. 6 is a simplified block diagram of a system 600 according to an embodiment of the present invention. System 600 can include an automated environment 602. Automated environment 602 can include a coordinator 604, which can be similar to coordinator 210 of FIG. 2, and various accessories 606(1)-606(N) with which coordinator 604 can communicate. (N can be any integer.) As described above, accessories 606 can include various objects or things in an environment that can be electronically controlled, such as any of accessories 104-122 of FIG. 1. Accessories 606 can operate similarly to accessories 204 of FIG. 2.

In this example, coordinator 604 can maintain a store of automation rules 608. As used herein, an automation rule can specify an action to be taken by one or more of accessories 606 and a triggering condition under which the action is to be taken. The action can be any action that can be performed by a specific accessory 606, and the rule can specify which accessory (or accessories) 606 is to act. The triggering condition can be any condition that is detectable by coordinator 604 or by any of accessories 606. For example, an automation rule can specify that a porch light (an accessory) is to be turned on if an outside ambient light sensor (which can be a separate accessory or a component of the porch light accessory) detects a light level below a threshold, or at a specific time each night (e.g., 6:30 pm), or at a time determined based on information available to coordinator 604 (e.g., sunset, where coordinator 604 can determine the time of sunset by accessing weather data via the Internet or the like). As another example, an action can include turning on a heating (or cooling) system to adjust the temperature of the house to a target temperature, or changing the target temperature for the heating (or cooling) system. The triggering condition for a temperature change can be, for example, a specific time (e.g., shortly before the time the user normally arrives at home) or a specific event (e.g., when the user actually arrives home). Additional examples are described below.

Automation rules 608 can be established in any manner desired. For example, a user can establish an automation rule by direct input (e.g., entering explicit instructions specifying a triggering condition and the action to be taken in response to that condition). In some embodiments, coordinator 604 or other components of system 600 can learn the users' behavior and define suggested automation rules, including rules based on aggregate patterns as described below. Coordinator 604 or other components of system 600 can present a suggested automation rule to the user, and the user can accept or decline the suggestion. Other techniques for establishing automation rules 608 can also be used.

In the example shown, coordinator 604 maintains all automation rules 608; however, other implementations are possible. For instance, an accessory 606 can maintain its own automation rule(s), provided that the accessory is capable of detecting the triggering condition and initiating the corresponding action.

A number of mobile devices 610(1)-610(M) can communicate with automated environment 602. (M can be any integer.) Each mobile device 610 can be, for example, a mobile phone, wearable device, or other electronic device that a user may habitually wear or carry while going about daily activities. Some or all of mobile devices 610 can be a controller for accessories 606. For example, as shown for mobile device 610(1), a mobile device can implement an accessory control app 612 and an accessory management daemon 614, which can be similar or identical to elements of controller 202 described above. Thus, mobile device 610 can communicate with components of automated environment 602 regardless of whether mobile device 610 is in physical proximity to the various devices of automated environment 602.

In addition, as shown for mobile device 610(1), each mobile device 610 can include a routine module 616 (e.g., implementing system 500 described above) that can determine an established user routine (including, e.g., pattern results 520). Mobile device 610 can also include a deviations module 618, which can analyze real-time data provided by location determining subsystem 502 and/or activity determining subsystem 504 and can compare the real-time location and/or activity data to pattern results 520 to determine whether the user's current location and/or activity is consistent or inconsistent with the established user routine. As used herein, a "deviation" can refer to any instance where the user's current location and/or activity is inconsistent with an established user routine. For instance, the established user routine can be used to predict a current location and/or activity, and this prediction can be compared with the real-time data. Examples of specific logic and processes for detecting deviations from an established user routine are described in above-referenced U.S. patent application Ser. No. 14/081,895.

In operation, each of mobile devices 610 can be owned or operated by a different user who frequents automated environment 602 (e.g., the residents of a home), and the users can interact with accessories 606 using mobile devices 610. In some embodiments, routine module 616 can collect and store accessory interaction data, e.g., using activity determining subsystem 504 of FIG. 5, in addition to other types of activity data. The accessory interaction data can include, e.g., which accessory 606 the user interacted with, what (if any) accessory operations the user invoked, information about where accessory 606 is located within automated environment 602, and time of the interaction. In some embodiments, the accessory interaction data can be time-correlated with location data gathered by location determining subsystem 502 of FIG. 5, and/or other activity data. In some embodiments, accessory interaction data is gathered only while mobile device 610 is in a key location, such as within automated environment 602.

As described above with reference to FIG. 5, the routine module in each mobile controller can generate pattern results based on its collected location and/or activity data. The pattern results can indicate a routine of the user, such as when the user typically moves between key locations and/or when the user performs other regularly occurring activities such as going to bed and rising from bed.

In embodiments of the present invention, each mobile device 610 can share its user-routine information (e.g., any or all of pattern results 520 of FIG. 5) with coordinator 604, and this can allow coordinator 604 to implement decision logic based on the collective routines of the users who frequent automated environment 602. For example, in an embodiment where automated environment 602 is a home, coordinator 604 can receive pattern results from a mobile device owned by each user who lives in the home and can store the received pattern results in shared pattern results data store 620. For example, as described above, each user who lives in the home can establish a pairing of his or her mobile device 610 with coordinator 604. This pairing can be used to provide a secure session for communicating between mobile device 610 and coordinator 604, and pattern results can be communicated via the secure session, so that access to information about the user's routine can be limited to mobile device 610 and coordinator 604.

In some embodiments, the pattern results that mobile device 610 shares with coordinator 604 can be limited to pattern results that are pertinent to operation of the coordinator 604 (e.g., to the automation of environment 602). For example, if automated environment 602 is a home, the shared pattern results can be limited to those patterns that are pertinent to the home. For example, home automation typically would not be affected by details of where users go or what they do when they are away from home, and such information can be excluded from the shared pattern results. For instance, the shared pattern information can include information about when the user routinely leaves the home or when the user routinely returns to the home, while excluding any information about where the user goes upon leaving or what the user does while gone. Similarly, shared pattern information can include information about selected activities that the user routinely performs while at home, such as the user's routine bedtime or waking time. In some embodiments, times associated with particular activities can be specified with a low resolution; for instance, instead of specifying that the user routinely leaves the house at 8:45 am, the shared pattern results can specify that the user routinely leaves between 8:00 am and 9:00 am.

It will be appreciated that system 600 is illustrative and that variations and modifications are possible. For example, coordinator 604 is shown as being physically located within automated environment 602. Where this is the case, user privacy can easily be protected, as user data (e.g., activity data, location data, and/or detected pattern data) can be stored locally on the user's mobile device 610 (the data need not be backed up to cloud-based or other remote storage systems) and/or on storage media local to coordinator 604. In some embodiments, mobile devices 610 can be configured to transmit pattern results to coordinator 604 only when they are physically present with coordinator 604 in automated environment 602, and this can also help to prevent interception of potentially sensitive data. Local storage can be further secured, e.g., using standard or advanced data encryption techniques and/or by limiting the visibility of the local storage device (e.g., data store 620 may be visible only to coordinator 604). In an alternative embodiment, part or all of the functionality of coordinator 604 can be implemented using a remote device (e.g., a cloud-based server) that communicates with environment 602 via a wide-area network such as the Internet; for instance, pattern analysis can be performed by a cloud-based server. Where this is the case, privacy safeguards (e.g., secure encryption of user data and/or aggregate pattern data) can be implemented to prevent unauthorized access to data.

Coordinator 604 can analyze the pattern data received from multiple mobile devices 610 to detect aggregate patterns across the users who frequent automated environment 602. For example, coordinator 604 can include its own pattern analysis module 622, which can implement algorithms similar to pattern analysis subsystem 506 of FIG. 5. Pattern analysis module 622 can operate on shared pattern results stored in data store 620 and can detect aggregate patterns across the users (or their controllers). As used herein, an "aggregate pattern," or "aggregate routine," can include any detected pattern or routine that incorporates behaviors of multiple mobile devices and/or multiple users. Further examples related to detecting aggregate patterns are described in above-referenced U.S. Provisional Application No. 62/057,724.

VI. Sparse Sensor Environment

In accordance with certain embodiments of the present invention, an automated environment (e.g., an automated home environment as described above) can provide the capability to monitor and analyze resource consumption by the automated environment. By combining knowledge of the resource consumption behavior of the environment with knowledge of the routines of users of the environment (including individual user routines and/or aggregate routines as described above), the automated environment can learn to detect anomalies in resource consumption and can alert users when an anomaly is detected.

Figure 7:
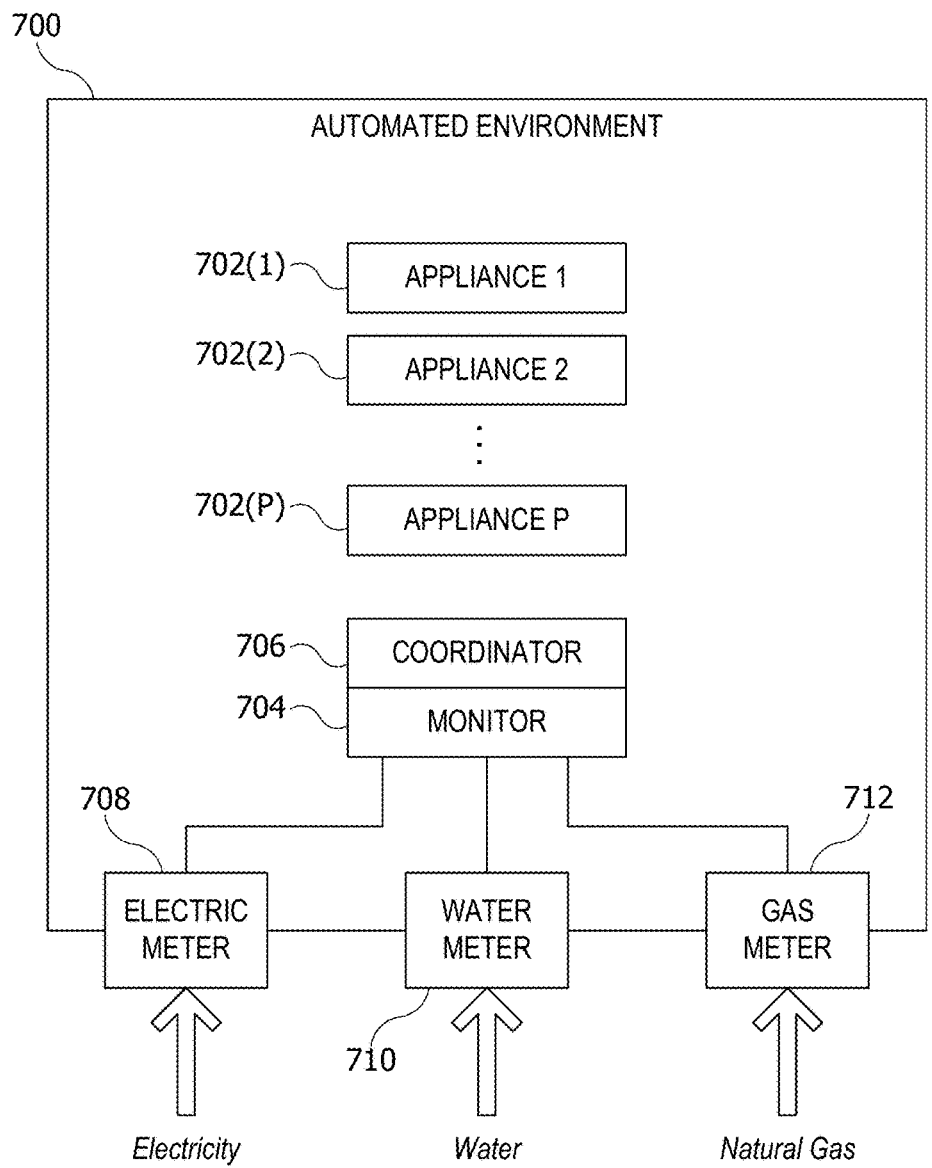
FIG. 7 is a simplified block diagram of an automated environment according to an embodiment of the present invention.

FIG. 7 is a simplified block diagram of an automated environment 700 according to an embodiment of the present invention. Automated environment 700 can be, for example, a home.

Automated environment 700 can include a number (P) of appliances 702(1)-702(P) that consume various resources, such as electricity, water, and/or natural gas, during their normal operation. The term "appliance" as used herein can refer generally to any electrical, mechanical, hydraulic, or similar device that may be operated in a particular environment (e.g., a home) and that consumes measurable resources during its normal operation. Examples include dishwashers, stoves, ovens, refrigerators, clothes washers, clothes dryers, water faucets, toilets, furnaces, air conditioners, lawn sprinklers (or other irrigation systems), computers, televisions, and so on. Depending on implementation, all, some, or none of appliances 702 can be instrumented as accessories (e.g., similar to any of accessories 104-122 of FIG. 1, accessories 204 of FIG. 2, accessories 606 of FIG. 6) in automated environment 700. That is, any given appliance 702 might or might not be communicably coupled to other components of automated environment 700.

Monitor 704 can be an electronic device located in (or based in) automated environment 700. In some embodiments, the same device can operate as a controller, coordinator, or other similar device described above (e.g., any of controller 102 of FIG. 1, controllers 202 of FIG. 2, mobile devices 610 or coordinator 604 of FIG. 6). For example, monitor 704 can communicate with mobile devices carried or worn by users who frequent automated environment 700 (e.g., residents of a home). Monitor 704 can also communicate with any of appliances 702 that happen to be instrumented as accessories. In various embodiments, monitor 704 may be communicably coupled with all, some, or none of appliances 702.

In some embodiments, monitor 704 can communicate with a coordinator 706, which can be similar to coordinator 604 of FIG. 6. Coordinator 706 can interact with mobile devices worn or carried by various users who frequent automated environment 700 (e.g., the residents of a home). Similarly to coordinator 604, coordinator 706 can collect information about each user's routine and can aggregate the information to detect an aggregate routine (or aggregate pattern) for automated environment 700. Monitor 704 and coordinator 706 can be implemented in the same electronic device (e.g., home computer, mobile device, tablet, set-top box, or other electronic device) or in different electronic devices that can communicate with each other to exchange information.

Automated environment 700 can also include various resource meters, such as electric meter 708, water meter 710, and gas meter 712. Each resource meter can include a sensor that is physically disposed at a point of entry for the resource into automated environment 700. The sensors of automated environment 700 can be considered environment-level resource consumption sensors.

Installation locations can be chosen that are readily accessible to the homeowner (or other manager of automated environment 700) and that detect the total amount of the resource being delivered into automated environment 700. Conveniently, many existing utility infrastructures provide a single point of entry for each resource (e.g., a house typically has one external water supply line, one external electric supply line, and one external gas supply line connected to it, regardless of the number of water, electrical, or gas outlets in the house), and the point of entry for a given resource can be a convenient location at which to install meters 708, 710, 712. In some embodiments, the resource meters can leverage existing sensors and meters provided by various utility providers to measure resource consumption; alternatively, a separate sensor can be installed in a similar location.

One or more of electric meter 708, water meter 710, and gas meter 712 can be instrumented as an accessory for automated environment 700. For instance, in the example shown, all three meters 708, 710, 712 communicate with monitor 704. The communication can include each meter 708, 710, 712 periodically reporting its reading (or a change since the last reading) to monitor 704. Accordingly, monitor 704 can determine environment-level resource consumption as a function of time, even if monitor 704 has no information as to the existence or behavior of appliances 702.

It will be appreciated that automated environment 700 is illustrative and that variations and modifications are possible. For example, FIG. 7 provides an example of a "sparse" sensor environment 700, in which relatively little information is available to devices tasked with managing automated environment 700, such as monitor 704 and coordinator 706. For instance, in some embodiments the only information that monitor 704 has about the automated environment can be the environment-level resource consumption data extracted from meters 708, 710, 712 and user-routine or aggregate-routine information provided by coordinator 706. It is to be understood that other embodiments can incorporate additional resource-consumption meters or sensors, such as sensors associated with specific appliances 702, and that such meters or sensors can be configured to communicate data to monitor 704. In some embodiments, monitor 704 can opportunistically exploit any sensor data that happens to be available, including data from any or all of meters 708, 710, 712. Specific examples are described below.

VII. Anomaly Detection

In operation, monitor 704 can collect resource-consumption data from one or more of meters 708, 710, 712. Monitor 704 can also collect user routine data from coordinator 706, including information about individual user routines, aggregate routines of environment 700, and deviations from any established routines (including user routines and/or aggregate routines). Monitor 704 can perform pattern analysis on the collected data to identify correlations between established routines (or deviations) and features of the resource-consumption data. For example, monitor 704 can correlate routine fluctuations in the rate of energy consumption with various user activities. For example, fluctuations in the rate of energy consumption can be correlated with patterns of user activities, as determined from information obtained from user devices. For instance, user activities can be tracked using a mobile device (e.g., a phone, tablet, or wearable device, such as a watch). Such information can include location of the device (e.g., within the home), time, or other actions (e.g., user input) on the device. If the location of the user device is within the kitchen at a time corresponding to a meal time, e.g., breakfast, lunch, or dinner, then a user activity of cooking can be identified. Activities of watching TV or bathroom usage (e.g., via a wearable device) can be identified in a similar manner. Interactions with other devices can also be used, if such devices have individual sensors, e.g., a particular sensor for a light.

Accordingly, monitor 704 can detect patterns of resource consumption for environment 700. Once resource-consumption patterns are detected, monitor 704 can detect anomalies that may occur in the resource-consumption behavior of automated environment 700 and can alert users of automated environment 700 when anomalies are detected. For example, if the resource-consumption behavior does not match one or more user activities, then an anomaly can be identified where the consumption deviation is not correlated with a user deviation from the established routine.

Figure 8:
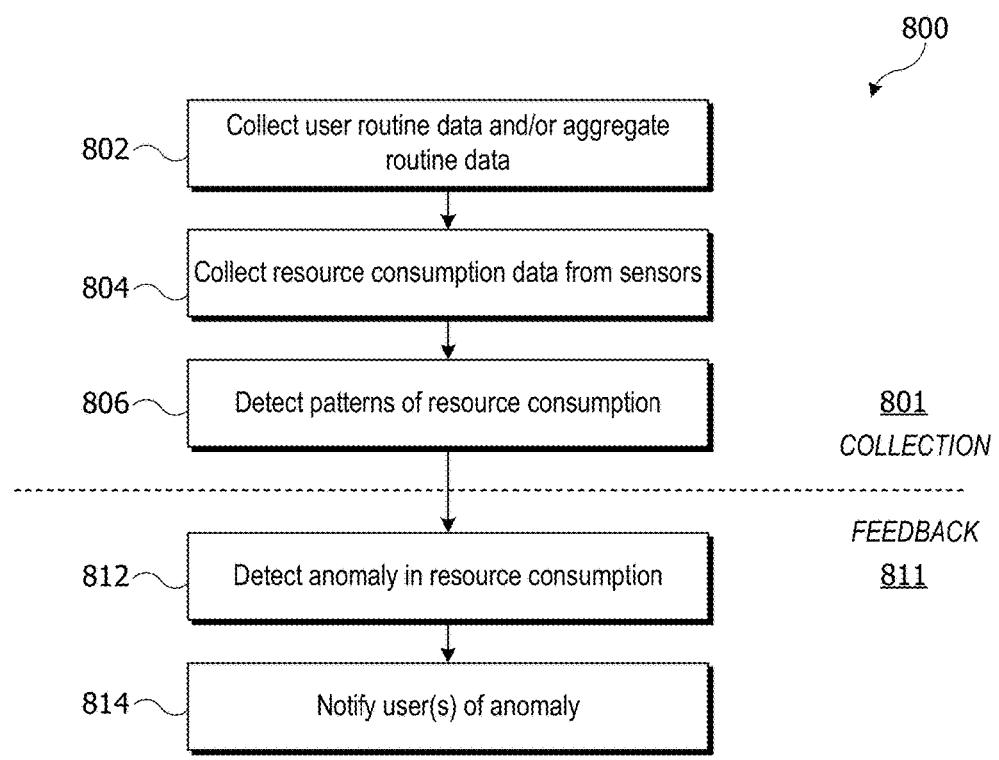
FIG. 8 is a flow diagram of a process for monitoring resource consumption according to an embodiment of the present invention.

FIG. 8 is a flow diagram of a process 800 for monitoring resource consumption according to an embodiment of the present invention. Process 800 can be implemented in an electronic device in an automated environment, e.g., monitor 704 in environment 700 of FIG. 7. As shown, process 800 can include a collection phase 801 and a feedback phase 811. Each phase can execute on an ongoing or recurring basis as desired.

Collection phase 801 can be performed periodically or as updated information becomes available. At block 802, process 800 can collect user routine data and/or aggregate routine data for users who frequent the automated environment (e.g., residents in a home). In some embodiments, coordinator 706 can generate user routine data and/or aggregate routine data in the manner described above and can provide the data to monitor 704 in real time, at regular intervals, or on request.

At block 804, process 800 can collect resource consumption data from resource-consumption sensors (e.g., any or all of electric meter 708, water meter 710, gas meter 712 of FIG. 7). In some embodiments, the resource-consumption sensors can report readings (data samples) at regular intervals, with any sampling rate desired, e.g., every second, every minute, every 5 minutes, every 30 minutes, every hour, etc. The sampling rate (also referred to as granularity) can be adjusted depending on the particular analysis to be done. For example, one type of analysis described below includes impulse-response modeling for a particular appliance, and relatively fine-grained sampling can be useful in distinguishing impulse responses of different appliances. Other types of analysis may be simplified by using a lower sampling rate. Where multiple sensors are being sampled, different sampling rates can be used, and the sampling rate for a particular sensor can be varied across time.

At block 806, process 800 can perform analysis on the collected data to detect patterns of resource consumption. Pattern analysis algorithms similar or identical to those used to detect user routines and/or aggregate routines (e.g., as described above) can be used in the analysis at block 806. In some instances, patterns can include correlations between resource consumption and user routines (including individual user routines and/or aggregated routines). Patterns can be detected on different time scales (e.g., daily, weekly, seasonally, etc.).

Many types of patterns can be detected. In one example, a spike (e.g., a significant but short-term increase) in water consumption may correlate with when users' routine sleeping periods end. For instance, users may habitually use the toilet and/or shower upon getting up in the morning, and this would result in a spike in water use. Electricity consumption may spike in the evening, correlated with users cooking dinner using an electric stove. Other fluctuations in resource consumption may be correlated with external indicia such as time of day, day of the week, outside weather, but not with known user routines. For example, there may be a spike in water consumption three days a week in the late evening due to lawn sprinklers running Monitor 704 may not have sufficient information to determine that the spike is caused by sprinklers, but it can nevertheless detect that the spike is part of a pattern. It should be understood that analysis at block 806 need not include explaining the cause of any correlations or patterns that may be detected; it is sufficient that the existence of a correlation or pattern is recognized.

Feedback phase 811 can be performed periodically (e.g., hourly, daily, or more or less frequently) using observed routine data and observed resource consumption data. At block 812, after a pattern of resource consumption has been established via pattern analysis at block 806, an anomaly can be detected, e.g., by comparing a prediction of resource consumption based on the detected pattern to observed resource consumption data provided by the sensors. An anomaly can be, for example, a consumption deviation from the established pattern that is not correlated with (or explained by) a user deviation from the (individual or aggregate) user routine. For example, if the residents of a home go on vacation, it would be expected that the observed resource consumption would be reduced. A deviation in the direction of reduction when the users are known to be on vacation, therefore, can be regarded as not anomalous. However, if the residents go on vacation and resource consumption increases, this may be considered anomalous.

In some embodiments, detection of anomalies can take into account other information available to monitor 704. For example, some or all of appliances 702 may be instrumented as accessories, and where this is the case, an accessory-appliance (or coordinator 706) can notify monitor 704 when the appliance is operating. Monitor 704 can take this information into account in detecting anomalies. For example, as described below, monitor 704 can learn a typical resource-consumption profile for an accessory-appliance and can use this information, together with information about when an accessory-appliance is operating, to determine whether observed resource-consumption data is consistent with a pattern or anomalous. Additional examples of anomaly detection are described below.

At block 814, one or more users of the automated environment can be notified of a detected anomaly. For example, a notification message can be sent to a user's mobile device or displayed on a user interface of monitor 704. The user can choose whether and how to act on the anomaly. For example, the user may know that a power-hungry device (e.g., a carpet shampooer) that is rarely used was being operated when an anomalous spike in electricity use was detected, and the user can choose to ignore the notification. Alternatively, the user can decide to investigate the cause of the anomaly. In some embodiments, if more detailed information about operations within automated environment 700 is available, the user can access that information to help identify the source of the anomaly.

It will be appreciated that process 800 described herein is illustrative and that variations and modifications are possible. Steps described as sequential may be executed in parallel, order of steps may be varied, and steps may be modified, combined, added or omitted. A variety of analysis and anomaly detection operations can be implemented, depending on the quantity and type of information available. Accordingly, some implementations can be based on a sparse sensor network that simply gathers data on resource consumption at the environment level and detects deviations from an expected pattern of resource consumption at that level as anomalies. Anomaly detection can be informed by knowledge about the users' routines and when the users are deviating from their routines (either individually or in the aggregate). In some instances, using the routines to inform anomaly detection can help to reduce false positives (i.e., where an anomaly is detected by process 800 in the absence of any problematic appliance behavior). Further, if additional information happens to be available (e.g., information about the behavior of specific appliances within the environment), that information can be incorporated into the analysis to further refine and improve anomaly detection. Accordingly, at least some of the benefits of resource-consumption monitoring and anomaly detection can be realized at relatively low cost (e.g., with only one or just a few inexpensive environment-level sensors) while the system can scale automatically to provide more extensive and precise anomaly detection and source identification as more of the environment becomes automated.

To further illustrate resource consumption monitoring and anomaly detection, specific use-case examples will now be described. Any or all of these use-cases can be implemented in combination, and these examples are not intended to be exhaustive.

VIII. Use Cases

A. Use-Case 1: Fault Detection

As used herein, a "fault" can refer to any abnormal condition in an appliance that affects its resource consumption behavior. Some faults may be immediately apparent to a parent (e.g., an appliance stops operating or won't start operating) while others (e.g., a leaking toilet, an inefficient refrigerator) are latent and may escape a user's notice for a long time. Detection of latent faults can be facilitated based on resource consumption monitoring as described herein.

For example, a persistent or recurring spike or increase in water consumption relative to an established water consumption pattern that is not correlated with any change in a user routines (individual or aggregate) may indicate that a leak has developed somewhere in the water system. Such an increase can be detected as an anomaly in the manner described above and can be reported to the user.

Additional information about properties of the anomaly (e.g., size and/or temporal characteristics) may help the user identify a source of the leak. For instance, a leaking toilet may result in a small intermittent increase in water use throughout the day, while a broken sprinkler head may result in a larger increase but only during times the sprinkler runs (e.g., once a day or every other day). A monitoring system as described above can present information to the user about the pattern of the anomaly, and this may help with diagnosis. For instance, the user may know when the sprinklers run even if the monitoring system does not, and information about when the anomaly occurs may help the user associate the anomaly with the sprinklers. In an embodiment where the monitoring system happens to know when the sprinklers run (e.g., a sprinkler system controller may be an accessory in the automated environment), the monitoring system itself can detect that water use is elevated, relative to predictions from the pattern, when the sprinklers are running but not at other times and can suggest that the user check the sprinkler system for possible leaks. In the case of a leaking toilet, the low level and intermittent nature of the increase may suggest that the user should check the toilets (or other appliances that have automatically-refilling water tanks) for leaks. Thus, when an anomaly is reported, a user can take action to identify its source and make appropriate repairs.

B. Use-Case 2: Tracing Fault to a Source

Another example of fault detection can pertain to electrical faults. In some embodiments, an electrical meter for a home environment can measure the power factor (a difference in phase between current and voltage on the power line, sometimes referred to as cosine phi). A change in power factor indicates a change in inductive load. Some fluctuations are to be expected (e.g., when a motor in a refrigerator starts up), but unexpected or unexplained changes in power factor may indicate a problem such as a faulty motor in an appliance. Accordingly, a monitoring system as described above can report anomalous spikes or fluctuations in the power factor.

Anomalous fluctuations can be correlated to the operation of specific appliances. For instance, in embodiments where some or all of the appliances are also accessories, the monitoring system can correlate the times of operating the accessories with the fluctuations and can identify or rule out various accessories as likely sources of the fluctuations based on the correlation or lack thereof. Where available, this information can guide the user to the actual source of the anomaly. In embodiments where the monitoring system does not know when the various appliances operate, the user may know, and temporal information about the anomaly can help the user identify its source.

C. Use-Case 3: Resource Consumption Profile for a Home Appliance

To facilitate recognizing anomalies and their possible sources, some monitoring systems can learn the normal resource-consumption behavior of specific appliances. In some embodiments, a monitoring system can define a resource-consumption profile for a specific appliance. For example, resource consumption by an appliance can be characterized using an impulse-response model, where the impulse can correspond to the start of operation (or particular operating conditions) and the response describes the resource use as a function of time during operation of the appliance. Other models can also be used.

In some instances, e.g., where one or more appliances are instrumented as accessories in the automated environment, the monitoring system can obtain information about when various appliances are or are not operating. Machine learning techniques can be applied to the resource consumption data to generate a characteristic resource consumption profile for a specific appliance. For any appliances that are not accessories, a similar approach can be used, although the user may need to provide information about when various appliances are operating in order to help train the system.

Once the resource consumption profiles are established, this information can be incorporated into anomaly detection. For example, when observed resource consumption data deviates from a baseline pattern of a resource consumption profiles (i.e. there is a discrepancy), the monitoring system can decompose the resource consumption data into contributions from the known resource-consumption profiles of various appliances. Accordingly, when separate resource consumption profiles are determined for each of a plurality of appliances in the automated environment, resource consumption data for a time period can be decomposed into contributions from the resource consumption profiles for the plurality of appliances and a residual contribution.

In embodiments where at least some appliances are accessories, known information about when the accessories are operating can be used to identify the contributions of the accessory-appliances to resource consumption. For appliances that are not accessories, a hypothesis-testing approach can be used to fit the resource profiles of various combinations of appliances to the observed data. Any residual contribution to the resource consumption can be reported as an anomaly or further analyzed to determine whether it is in fact anomalous.

As another example, in cases where the time of starting a particular appliance is known and a resource consumption profile for the appliance is also known, the contribution of that appliance to the resource consumption data can be predicted, and the prediction can be compared to observed data. If the prediction does not match the observation (i.e. there is a discrepancy), this can indicate an anomaly that can be attributed to the appliance in question.

D. Use-Case 4: Correlating Sensor Data

In some instances, an anomaly can be detected by correlating data from a resource-consumption sensor with data from another sensor in the automated environment. For instance, one common sensor in a home is an indoor temperature sensor. Such sensors are often used in thermostats to regulate the temperature of the home, and the sensor or the thermostat can be instrumented as an accessory in an automated environment. Thus, a monitoring system can have information about resource consumption and indoor temperature. This can facilitate detection of anomalies, e.g., in home heating and/or cooling systems.

For instance, in the summer, the thermostat may be set to turn on an air conditioning unit when the indoor temperature exceeds an upper limit, and operation of the air conditioning unit is expected to drive the indoor temperature toward a target. If the power consumption behavior of the home indicates that the air conditioning unit is on but the indoor temperature is not changing toward the target temperature, this may indicate a problem with the air conditioning unit. A user can be alerted and can investigate.

E. Use-Case 5: Context-Aware Alarms

Another type of sensor that is often present in a home environment is a smoke detector, which is intended to warn residents of a possible fire. However, many smoke detectors are not able to distinguish incidental smoke (e.g., from cooking) from an actual fire.

In some embodiments, resource consumption monitoring can be used to dynamically regulate the sensitivity of a smoke detector. The smoke detector can be an accessory in the automated home environment. As described above, resource-consumption profiles for various household appliances can be established. Such appliances can include a kitchen stove. A monitoring system can use the resource-consumption profile to detect when the kitchen stove is in use, even if the kitchen stove is not instrumented as an accessory in the automated environment. When the kitchen stove is in use, the sensitivity of a smoke detector in the home can be automatically reduced (on the assumption that users are awake and alert to the possibility of fire), and when the use of the kitchen stove ends, the smoke detector can be returned to normal sensitivity. In some embodiments, only a smoke detector located near the kitchen would have its sensitivity modified in this manner. It should also be noted that the smoke detector need not be completely disabled, so that a fire would still be detectable while incidental cooking smoke does not result in a disruptive alarm.

F. Use-Case 6: Predictive Analysis

As noted above, resource consumption in an automated environment can be correlated with user routines. To the extent that future deviations from the user routines can be predicted, changes in resource consumption can also be predicted. For instance, in some embodiments, a coordinator of the automated environment can determine when the residents of a home will likely be going away on vacation (e.g., based on calendar data in the users' mobile devices). It can be inferred that resource consumption will be reduced during the vacation period. The monitoring system can have information about resource consumption when users are gone as compared to resource consumption when users are present, and this information can be used to predict the changes in resource consumption with more specificity (e.g., not just that electricity use will be reduced, but by how much). This information can be useful, e.g., for planning purposes, as well as for detecting anomalies while the users are gone. Accordingly, a monitoring device can receive data indicative of a predicted future deviation from the established routine; and the monitor device can predict a change in the resource consumption behavior resulting from the predicted future deviation.

G. Other Examples of Resource Consumption Monitoring

The examples of resource consumption monitoring and analysis given above are intended to be illustrative and not limiting.

It should be understood that the techniques described herein do not require that the automated environment include any accessories other than a sparse sensor set (e.g., as described above) that allows monitoring of consumption of one or more resources by the automated environment as a whole. Thus, to obtain benefits of resource consumption monitoring as described herein, a homeowner (or other user) may only need to install a small number of relatively inexpensive sensors on utility lines leading into the home (or other environment to be monitored), as described above. Even just one sensor for one type of resource can provide some benefit. Such installations can easily pay for themselves to the extent that faults in appliances can be more quickly identified and corrected, which can reduce resource consumption and therefore the operating costs of the automated environment. That said, it may be possible to realize increased benefits if more detailed information is available, e.g., by replacing old appliances with newer models that provide automated accessory behavior. The monitoring system can adapt to the addition of new accessories by performing increasingly robust analysis as a richer data set becomes available and by providing more specific information about the nature and/or likely sources of detected anomalies.

Consumption of other types of resources can also be monitored, in addition to or instead of standard utilities such as electricity, water, and/or natural gas. For example, use of data resources can be monitored (e.g., by recording the number of data packets or bytes flowing into or out of the environment without examining the content thereof). Anomalous patterns of data use may indicate, for instance, that an offsite backup process is failing, that scheduled external data communications are not occurring, that someone outside the home is exploiting a home Wi-Fi network, or other anomalies in household data use.

Embodiments of the present invention are not limited to home environments. For example, resource use can be monitored in office buildings, schools, retail stores, and other locations, and detected anomalies can be reported to a building or facilities manager.

Still other examples will be apparent to those skilled in the art with access to the present disclosure.

IX. Further Embodiments

While the invention has been described with respect to specific embodiments, one skilled in the art will recognize that numerous modifications are possible. Controller networks and/or accessory networks can include as many or as few devices as desired. Use of a coordinator is not required; regardless of the number of accessories or number of controllers, it is always possible (at least in principle) to establish pairings between each controller and each accessory and to have all controllers operate by controlling accessories directly.

Further, where a coordinator is present, it can be but need not be the case that all controllers are permitted to access all accessories via the coordinator. For instance, some controllers might be restricted from accessing accessories when not within the local environment, and some accessories might require that controllers access them directly rather than through a coordinator.

In addition, while the foregoing description makes reference to a home as an example of an environment that can be automated, embodiments of the invention are not limited to the home environment. Embodiments of the present invention can be implemented in any environment where a user wishes to control one or more accessory devices using a controller device, including but not limited to homes, cars or other vehicles, office buildings, campuses having multiple buildings (e.g., a university or corporate campus), etc.

Similarly, some embodiments are described in connection with a single user or a single mobile controller device. It is to be understood that a home (or other automated environment) can have multiple occupants using multiple controller devices, and the techniques described herein can be applied with respect to any or all of the occupants (users) and controllers that may be associated with a given automated environment. In some examples described above, mobile controllers can provide user-specific data (e.g., pattern results) to a coordinator in the automated environment. In some embodiments, users can opt out of sharing data with the coordinator or select the amount of data to be shared. In the interest of protecting privacy, the coordinator can retain user-specific data locally (e.g., data need not be backed up to the cloud) and store the data securely (e.g., using encryption or the like). In addition, retention of received data can be limited such that only recent user-specific data or environment-level pattern data is stored. For example, the coordinator can be configured to store only the most recent user-specific data from a particular device and to discard environment-level pattern or routine data for a fixed length of time (e.g., four months, eight months, etc.).

Embodiments of the present invention can be realized using any combination of dedicated components and/or programmable processors and/or other programmable devices. The various processes described herein can be implemented on the same processor or different processors in any combination. Where components are described as being configured to perform certain operations, such configuration can be accomplished, e.g., by designing electronic circuits to perform the operation, by programming programmable electronic circuits (such as microprocessors) to perform the operation, or any combination thereof. Further, while the embodiments described above may make reference to specific hardware and software components, those skilled in the art will appreciate that different combinations of hardware and/or software components may also be used and that particular operations described as being implemented in hardware might also be implemented in software or vice versa.

Computer programs incorporating various features of the present invention may be encoded and stored on various computer readable storage media; suitable media include magnetic disk or tape, optical storage media such as compact disk (CD) or DVD (digital versatile disk), flash memory, and other non-transitory media. (It is understood that "storage" of data is distinct from propagation of data using transitory media such as carrier waves.) Computer readable media encoded with the program code may be packaged with a compatible electronic device, or the program code may be provided separately from electronic devices (e.g., via Internet download or as a separately packaged computer-readable storage medium).

Thus, although the invention has been described with respect to specific embodiments, it will be appreciated that the invention is intended to cover all modifications and equivalents within the scope of the following claims.

What is claimed is:

1. A method comprising:
   identifying, by a monitoring device configured to monitor one or more appliances and one or more environment level resource consumption sensors of one or more meters in an automated environment, a pattern of resource consumption for the automated environment, the pattern including a correlation between resource consumption data received from one or more environment level resource consumption sensors of one or more meters in the automated environment and user routine data from one or more mobile devices of one or more users who interact with the automated environment, wherein the user routine data is indicative of an established routine for the one or more users who frequent the automated environment, wherein the one or more environment level resource consumption sensors are included in the one or more meters that measure an amount of one or more resources consumed by the one or more appliances in the automated environment;
   detecting, by the monitoring device based on sensor data from the one or more meters, an anomaly in a resource consumption behavior of the automated environment, wherein the anomaly includes a consumption deviation of an observed resource consumption from the pattern of resource consumption in the automated environment, wherein the consumption deviation is not correlated with a user deviation from the established routine; and
   notifying at least one of the one or more users of the anomaly by providing a notification of the anomaly to the one or more mobile devices of the one of more users of the automated environment.

2. The method of claim 1, wherein the one or more environment level resource consumption sensors include one or more of a group consisting of:
   an electric meter;
   a water meter; and
   a gas meter.

3. The method of claim 1, wherein identifying the pattern of resource consumption includes:
   collecting the resource consumption data from the environment level resource consumption sensors; and
   collecting the user routine data from a mobile device belonging to one of the one or more users who frequent the automated environment.

4. The method of claim 1, wherein identifying the pattern of resource consumption includes:
   collecting the resource consumption data from the environment level resource consumption sensors;
   collecting the user routine data from a plurality of mobile devices belonging to a plurality of users who frequent the automated environment; and
   detecting an aggregate routine for the automated environment based on the user routine data.

5. The method of claim 1, wherein identifying the pattern of resource consumption includes determining a resource consumption profile for the one or more appliances located in the automated environment.

6. The method of claim 5, wherein the resource consumption profile includes an impulse response model.

7. The method of claim 5, wherein the one or more appliances communicate with the monitoring device to provide information indicating when the one or more appliances are operating.

8. The method of claim 5, further comprising:
   receiving, at the monitoring device, user input indicating when the one or more appliances are operating.

9. The method of claim 5, wherein detecting the anomaly includes detecting a discrepancy between the resource consumption profile and the observed resource consumption while the one or more appliances are operating.

10. The method of claim 5, wherein separate resource consumption profiles are determined for each of a plurality of appliances in the automated environment and wherein detecting the anomaly includes:
    decomposing resource consumption data for a time period into contributions from the resource consumption profiles for the plurality of appliances and a residual contribution; and
    determining whether the residual contribution represents an anomaly.

11. The method of claim 1, wherein detecting the anomaly includes detecting an increase in the observed resource consumption relative to the pattern.

12. The method of claim 1, further comprising:
    providing, to the one or more users, additional information about a characteristic of the anomaly, including one or more of a temporal characteristic and/or a size characteristic.

13. The method of claim 1, wherein the anomaly includes a change in a power factor on a power line leading into the automated environment.

14. The method of claim 1, wherein detecting the anomaly includes correlating resource consumption sensor data with data from another sensor in the automated environment.

15. The method of claim 14, wherein the other sensor is an indoor temperature sensor.

16. The method of claim 1, further comprising:
    receiving, at the monitoring device, data indicative of a predicted future deviation from the established routine; and
    predicting, at the monitor device, a change in the resource consumption behavior resulting from the predicted future deviation.

17. The method of claim 16, further comprising:
    when the predicted future deviation from the established routine subsequently occurs, using the predicted change in the resource consumption behavior to detect an anomaly in the resource consumption behavior.

18. The method of claim 1, wherein the automated environment is a home environment.

19. The method according to claim 1, wherein the one or more environment level resource consumption sensors are located at a point of entry of one or more corresponding resources into the automated environment.

20. The method according to claim 1, wherein the one or more environment level resource consumption sensors periodically report resource consumption readings to the monitoring device.

21. The method according to claim 1, wherein the one or more appliances comprise a water-consuming appliance.

22. The method according to claim 1, wherein the one or more users are notified via one or more mobile devices belonging to the one or more users.

23. The method according to claim 1, wherein the one or more users are notified of the anomaly in order for the one of more users to identify and correct a fault in the one or more appliances.

24. An electronic device configured to monitor one or more appliances and one or more environment level resource consumption sensors of one or more meters in an automated environment, the electronic device comprising:
a communication interface to communicate with one or more sensors of one or more meters in an automated environment; and
a processor coupled to the communication interface and configured to:
identify a pattern of resource consumption for the automated environment, the pattern including a correlation between resource consumption data received from the one or more sensors in the automated environment and user routine data from one or more mobile devices of one or more users who frequent the automated environment, wherein the user routine data is indicative of an established routine for one or more users who frequent the automated environment, wherein the one or more are included in the one more meters that measure an amount of one or more resources consumed by the one or more appliances in the automated environment;
detect an anomaly in a resource consumption behavior of the automated environment based on sensor data from the one or more meters, wherein the anomaly includes a consumption deviation of an observed resource consumption from the pattern of resource consumption in the automated environment, wherein the consumption deviation is not correlated with a user deviation from the established routine; and
notify at least one of the one or more users of the anomaly by providing a notification of the anomaly to the one or more mobile devices of the one of more users of the automated environment.

25. A non-transitory machine-readable storage medium storing instructions that, when executed, causes at least one processing device to perform a method comprising:
identifying, by a monitoring device in an automated environment configured to monitor one or more appliances and one or more environment level resource consumption sensors of one or more meters, a pattern of resource consumption for the automated environment, the pattern including a correlation between resource consumption data received from one or more environment level resource consumption sensors of one or more meters in the automated environment and user routine data from one or more mobile devices of one or more users who frequent the automated environment, wherein the user routine data is indicative of an established routine for the one or more users who frequent the automated environment, wherein the one or more environment level resource consumption sensors are included in one more meters that measure an amount of one or more resources consumed by the one or more appliances in the automated environment;
detecting, by the monitoring device, an anomaly in a resource consumption behavior of the automated environment based on sensor data from the one or more meters, wherein the anomaly includes a consumption deviation of an observed resource consumption from the pattern of resource consumption in the automated environment, wherein the consumption deviation is not correlated with a user deviation from the established routine; and
notifying at least one of the one or more users of the anomaly by providing a notification of the anomaly to the one or more mobile devices of the one of more users of the automated environment.

\* \* \* \* \*